US 10,964,571 B2

(12) United States Patent
Sekiya

(10) Patent No.: US 10,964,571 B2
(45) Date of Patent: Mar. 30, 2021

(54) CONVEYANCE SYSTEM

(71) Applicant: DISCO CORPORATION, Tokyo (JP)

(72) Inventor: Kazuma Sekiya, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/812,894

(22) Filed: Mar. 9, 2020

(65) Prior Publication Data

US 2020/0312688 A1 Oct. 1, 2020

(30) Foreign Application Priority Data

Mar. 26, 2019 (JP) .............................. JP2019-057710

(51) Int. Cl.
*H01L 21/677* (2006.01)
*B65G 1/04* (2006.01)

(52) U.S. Cl.
CPC ...... *H01L 21/67724* (2013.01); *B65G 1/0492* (2013.01); *H01L 21/67706* (2013.01)

(58) Field of Classification Search
CPC ........... H01L 21/67724; H01L 21/6773; H01L 21/67733
See application file for complete search history.

(56) References Cited

U.S. PATENT DOCUMENTS

| 6,851,913 | B2 * | 2/2005 | Iizuka ...................... B66C 1/28 414/626 |
| 7,887,278 | B2 * | 2/2011 | Hoshino ............. H01L 21/6773 414/217.1 |
| 8,105,005 | B2 * | 1/2012 | Yoshida ............ H01L 21/67733 414/282 |
| 2005/0079041 | A1 * | 4/2005 | Campbell ......... H01L 21/67775 414/626 |
| 2009/0067957 | A1 * | 3/2009 | Ando .................. H01L 21/6773 414/222.05 |
| 2015/0340253 | A1 * | 11/2015 | Oosterlaken ...... H01L 21/67736 414/172 |
| 2017/0278736 | A1 * | 9/2017 | Iwasaki ............... H01L 21/6773 |

FOREIGN PATENT DOCUMENTS

JP          06177244 A      6/1994

* cited by examiner

*Primary Examiner* — Jonathan Snelting
(74) *Attorney, Agent, or Firm* — Greer Burns & Crain Ltd.

(57) ABSTRACT

A conveyance system for conveying a workpiece to each of a plurality of processing apparatuses includes a conveyance passage, an automated conveying vehicle for travelling on the conveyance passage, the automated conveying vehicle including a workpiece storage member, travelling mechanisms, and a receiver, a stock unit including a storage member holding base and a receiver, and a storage member conveying unit for conveying the workpiece storage member between a region of the conveyance passage above the stock unit and the storage member holding base or between a region of the conveyance passage above the processing apparatus and the inside of the processing apparatus.

4 Claims, 26 Drawing Sheets

CONVEYANCE SYSTEM

BACKGROUND OF THE INVENTION

Field of the Invention

The present invention relates to a conveyance system that conveys a workpiece to a processing apparatus.

Description of the Related Art

In a manufacturing step of device chips incorporated into electronic equipment and so forth, a plate-shaped workpiece typified by a semiconductor wafer or resin package substrate is processed by various kinds of processing apparatuses. When the workpiece is conveyed to this processing apparatus, normally a cassette for conveyance that can house plural workpieces is used.

Incidentally, in the above-described method in which plural workpieces are housed in the cassette and are conveyed to a processing apparatus at a time, unprocessed workpieces housed in the cassette are made to wait without exception when the processing apparatus stops due to any cause. That is, processing of the unprocessed workpieces by another processing apparatus also becomes impossible and thus the efficiency of the processing greatly lowers.

To solve this problem, for example, it is preferable to convey workpieces to a processing apparatus one by one according to the operation status of the processing apparatus. Thus, a conveyance system has been proposed in which plural processing apparatuses are coupled by a path for conveyance and a workpiece can be conveyed to each processing apparatus at an arbitrary timing (for example, refer to Japanese Patent Laid-open No. Hei 6-177244).

SUMMARY OF THE INVENTION

However, a conduit connecting part to which conduits are connected, a door for maintenance, and so forth are disposed on a side surface of each processing apparatus, and the path for conveyance needs to be designed in such a manner as not to interfere with them when the above-described conveyance system is constructed. For this reason, constructing the conveyance system is not necessarily easy and the path for conveyance also tends to become long.

Thus, an object of the present invention is to provide a conveyance system that can convey a workpiece to each of plural processing apparatuses and is also easy to construct.

In accordance with an aspect of the present invention, there is provided a conveyance system for conveying a workpiece to each of a plurality of processing apparatuses. The conveyance system includes a conveyance passage disposed in a space directly above the processing apparatus across a plurality of the processing apparatuses, an automated conveying vehicle for traveling on the conveyance passage, the automated conveying vehicle including a storage member for storing a workpiece, traveling mechanisms mounted on the storage member, and a receiver for receiving control signals, a stock unit including a storage member holding base for holding the storage member in transferring the workpiece from a workpiece stocker storing workpieces therein to the storage member of the automated conveying vehicle, and a receiver for receiving control signals, a storage member conveying unit for conveying the storage member between a region of the conveyance passage above the stock unit and the storage member holding base of the stock unit or between a region of the conveyance passage above the processing apparatus and an inside of the processing apparatus, and a control unit including a transmitter for transmitting control signals to the processing apparatus, the automated conveying vehicle, and the stock unit, a receiver for receiving notification signals transmitted from the processing apparatus, and a control signal generating section for generating control signals to be transmitted from the transmitter. The control signal generating section of the control unit generates control signals to be transmitted from the transmitter of the control unit on a basis of notification signals received by the receiver of the control unit, the transmitter of the control unit transmits control signals generated by the control signal generating section of the control unit to the processing apparatus, the automated conveying vehicle, and the stock unit, the automated conveying vehicle travels on the conveyance passage on a basis of control signals received by the receiver, and the storage member of the automated conveying vehicle is conveyed, together with the workpiece stored in the storage member, from the region of the conveyance passage above the processing apparatus to the inside of the processing apparatus.

In this conveyance system, it is preferable that the conveyance passage be set on an upper surface of the processing apparatus.

Furthermore, in this conveyance system, the automated conveying vehicle may include the storage member conveying unit.

A conveyance system according to an aspect of the present invention includes a conveyance passage disposed across a plurality of processing apparatuses, an automated conveying vehicle for traveling on the conveyance passage, the automated conveying vehicle including a workpiece storage member for storing a workpiece, traveling mechanisms mounted on the workpiece storage member, and a receiver for receiving control signals, a stock unit including a storage member holding base for holding the workpiece storage member in transferring the workpiece from a workpiece stocker storing workpieces therein to the workpiece storage member of the automated conveying vehicle, and a receiver for receiving control signals, and a storage member conveying unit for conveying the workpiece storage member between a region of the conveyance passage above the stock unit and the storage member holding base of the stock unit or between a region of the conveyance passage above the processing apparatus and the inside of the processing apparatus.

Therefore, by conveying the workpiece storage member of the automated conveying vehicle that has received the workpiece from the workpiece stocker in the stock unit to the conveyance passage with the storage member conveying unit and propelling the automated conveying vehicle on the conveyance passage, it is possible to convey workpieces respectively to the plurality of processing apparatuses. The workpiece storage member of the automated conveying vehicle is conveyed into the processing apparatus by the storage member conveying unit after the automated conveying vehicle has been propelled to travel, for example.

Furthermore, in the conveyance system according to the aspect of the present invention, the conveyance passage is set in a space directly above the processing apparatus. For this reason, the structures of the side surfaces of each processing apparatus do not need to be considered when this conveyance passage is designed. That is, construction of the conveyance system becomes easy.

The above and other objects, features and advantages of the present invention and the manner of realizing them will become more apparent, and the invention itself will best be understood from a study of the following description and appended claims with reference to the attached drawings showing preferred embodiments of the invention.

DETAILED DESCRIPTION OF THE PREFERRED EMBODIMENTS

Embodiments of the present invention will be described with reference to the accompanying drawings. In the following respective embodiments, conveyance systems that convey workpieces and so forth to plural cutting apparatuses will be described. However, it suffices for the conveyance system of the present invention to be configured to be capable of conveying workpieces and so forth to plural processing apparatuses. That is, the conveyance destination of the workpiece and so forth may be a processing apparatus other than a cutting apparatus.

For example, the conveyance system of the present invention is configured to be capable of conveying workpieces to plural laser processing apparatuses in some cases. Furthermore, for example, the conveyance system of the present invention is configured to be capable of conveying a workpiece sequentially to plural kinds of processing apparatuses used for a series of processing in other cases. In the present description, all apparatuses that can be used in a series of steps for processing a workpiece will be referred to as processing apparatuses. Specifically, the processing apparatuses in the present description include a tape sticking apparatus, an ultraviolet radiation applying apparatus, a cleaning apparatus, and so on that may not necessarily be aimed at processing a workpiece.

(Embodiment 1)

Figure 1:
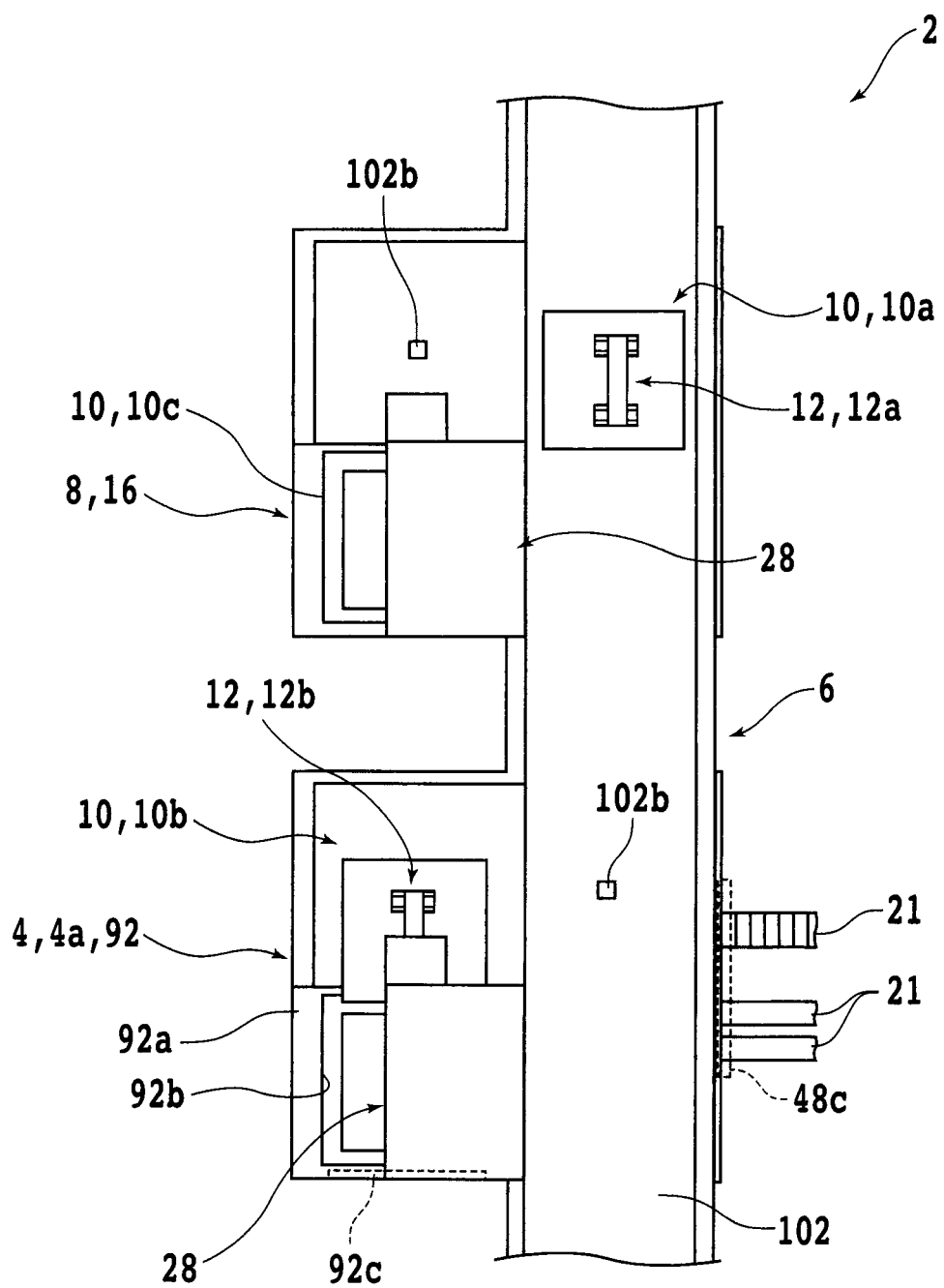
FIG. 1 is a plan view illustrating a configuration example of a conveyance system according to embodiment 1.
Figure 2:
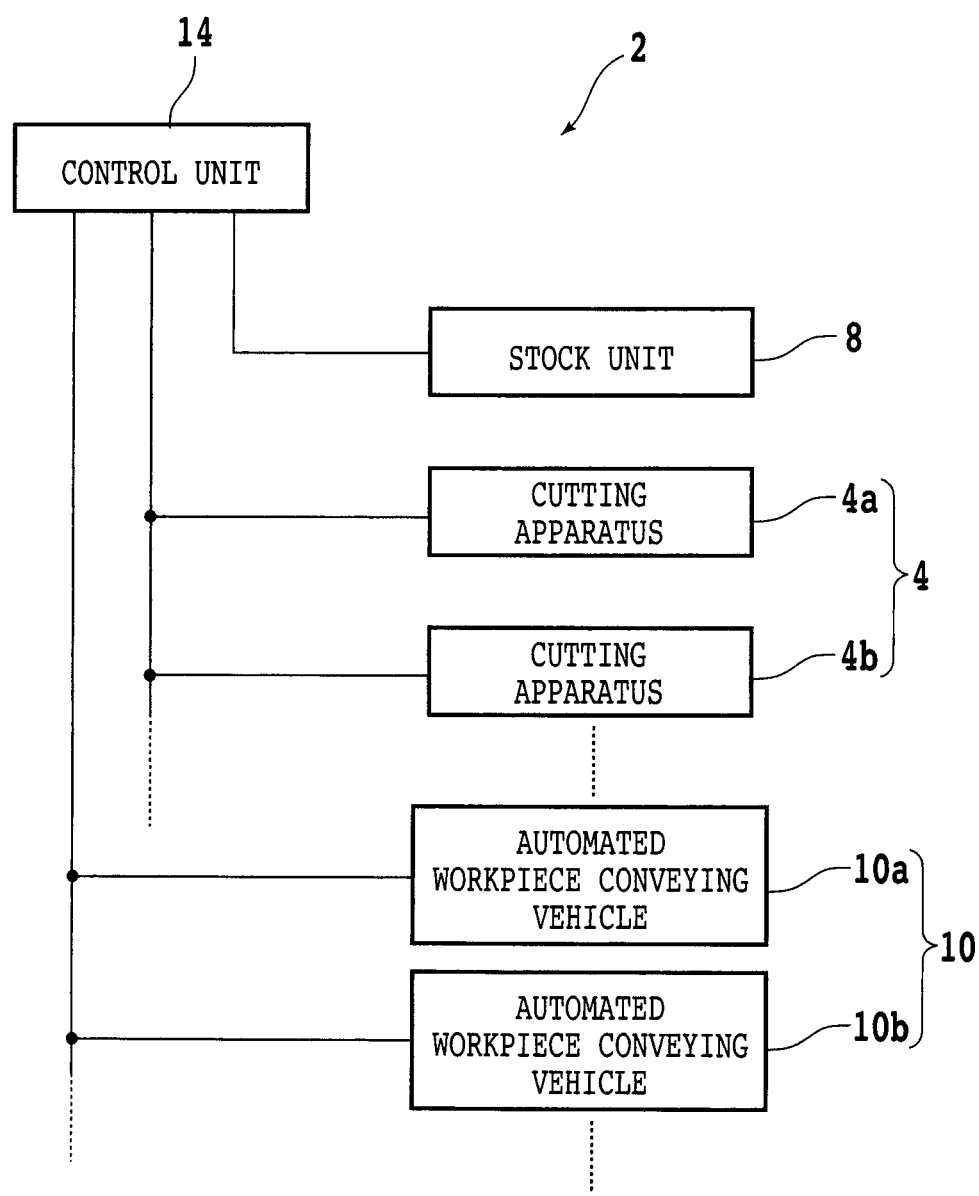
FIG. 2 is a functional block diagram illustrating an example of the connection relationship of the conveyance system according to embodiment 1.

FIG. 1 is a plan view illustrating a configuration example of a conveyance system 2 according to the present embodiment and FIG. 2 is a functional block diagram illustrating an example of the connection relationship of the conveyance system 2. As illustrated in FIG. 1, the conveyance system 2 according to the present embodiment includes a conveyance passage 6 for conveying a plate-shaped workpiece 11 (see FIG. 4B and so forth) processed by a cutting apparatus (processing apparatus) 4.

The workpiece 11 is a wafer that is composed of a semiconductor material such as silicon and has a circular disc shape, for example. The front surface side of this workpiece 11 is segmented into plural small regions by plural planned dividing lines (streets) intersecting each other and a device such as an integrated circuit (IC) or a micro electro mechanical system (MEMS) is formed in each small region.

A tape (dicing tape) 13 with a diameter larger than the workpiece 11 is stuck to the back surface side of the workpiece 11. The peripheral part of the tape 13 is fixed to a ring-shaped frame 15 that surrounds the workpiece 11. The workpiece 11 is conveyed to the cutting apparatus 4 in the state of being supported by the frame 15 with the intermediary of this tape 13.

Although the wafer that is composed of a semiconductor material such as silicon and has a circular disc shape is employed as the workpiece 11 in the present embodiment, there is no limit to the material, shape, structure, size, and so forth of the workpiece 11. For example, it is also possible to use a substrate or the like composed of a material such as another semiconductor, ceramic, resin, or metal as the workpiece 11.

Similarly, there is no limit also to the kind, quantity, shape, structure, size, arrangement, and so forth of the devices. The devices do not have to be formed on the workpiece 11. According to the present embodiment, the workpiece 11 supported on the frame 15 by the tape 13 is treated as a target to be conveyed. However, the workpiece 11 to which the tape 13 is not stuck, the workpiece 11 not supported on the frame 15, or the like may also be treated as a target to be conveyed.

Furthermore, the cutting apparatus 4 that processes this workpiece 11 is connected to the conveyance system 2 as the conveyance destination of the workpiece 11. However, the cutting apparatus 4 is not necessarily a constituent element of the conveyance system 2. Thus, the cutting apparatus 4 may be changed or omitted according to the form of use of the conveyance system 2 as described above.

Then, for convenience of description, only one cutting apparatus 4a is illustrated in FIG. 1 and two cutting apparatuses 4a and 4b are illustrated in FIG. 2. However, in the present embodiment, two or more cutting apparatuses 4 are necessary as the conveyance destination of the workpiece 11. That is, the number of processing apparatuses connected to the conveyance system 2 is two or more.

The conveyance passage 6 is disposed across plural cutting apparatuses 4 so that the workpiece 11 can be conveyed to each cutting apparatus 4. That is, the plural cutting apparatuses 4 are coupled to each other through the conveyance passage 6. Furthermore, the conveyance passage 6 is disposed in a space directly above the cutting apparatus 4. For this reason, the conveyance passage 6 does not interfere with conduits 21 and so forth connected to a side surface of each cutting apparatus 4.

Below the conveyance passage 6, a stock unit 8 that can house plural workpieces 11 is disposed besides the cutting apparatus 4. The workpiece 11 housed in the stock unit 8 is carried in to an automated workpiece conveying vehicle (automated conveying vehicle) 10 at an arbitrary timing. The automated workpiece conveying vehicle 10 travels on the conveyance passage 6 and conveys the workpiece 11 to each cutting apparatus 4. Although three automated workpiece conveying vehicles 10a, 10b, and 10c are illustrated in FIG. 1 and two automated workpiece conveying vehicles 10a and 10b are illustrated in FIG. 2, there is no limit to the number of automated workpiece conveying vehicles 10.

As illustrated in FIG. 1, a conveying unit (storage member conveying unit) 12 is mounted on an upper portion of each of the automated workpiece conveying vehicles 10. The conveying unit 12 enables the automated workpiece conveying vehicle 10 to be conveyed between a region of the conveyance passage 6 above each of the cutting apparatus 4 and the inside of the cutting apparatus 4 or between a region of the conveyance passage 6 above the stock unit 8 and the inside of the stock unit 8.

According to the present embodiment, the conveying unit 12 is illustrated as mounted on the automated workpiece conveying vehicles 10. However, the conveying unit 12 may not necessarily be mounted on the automated workpiece conveying vehicles 10. Similarly, the conveying unit 12 may not necessarily be controlled by the automated workpiece conveying vehicles 10. Conveying units 12 may be mounted on the cutting apparatus 4, the conveyance passage 6, the stock unit 8, and so on, and may be controlled by the cutting apparatus 4, the conveyance passage 6, the stock unit 8, and so on. The conveying units 12 may of course be independent of other constituent elements.

As illustrated in FIG. 2, to the cutting apparatuses 4, the stock unit 8, and the automated workpiece conveying vehicles 10 (including the conveying unit 12), a control unit 14 that controls operation of them is wirelessly connected. However, it suffices for the control unit 14 to be configured to be capable of controlling operation of the cutting apparatuses 4, the stock unit 8, and the automated workpiece conveying vehicles 10 (including the conveying unit 12) and the control unit 14 may be connected to them in a wired manner in some cases.

Figure 3:
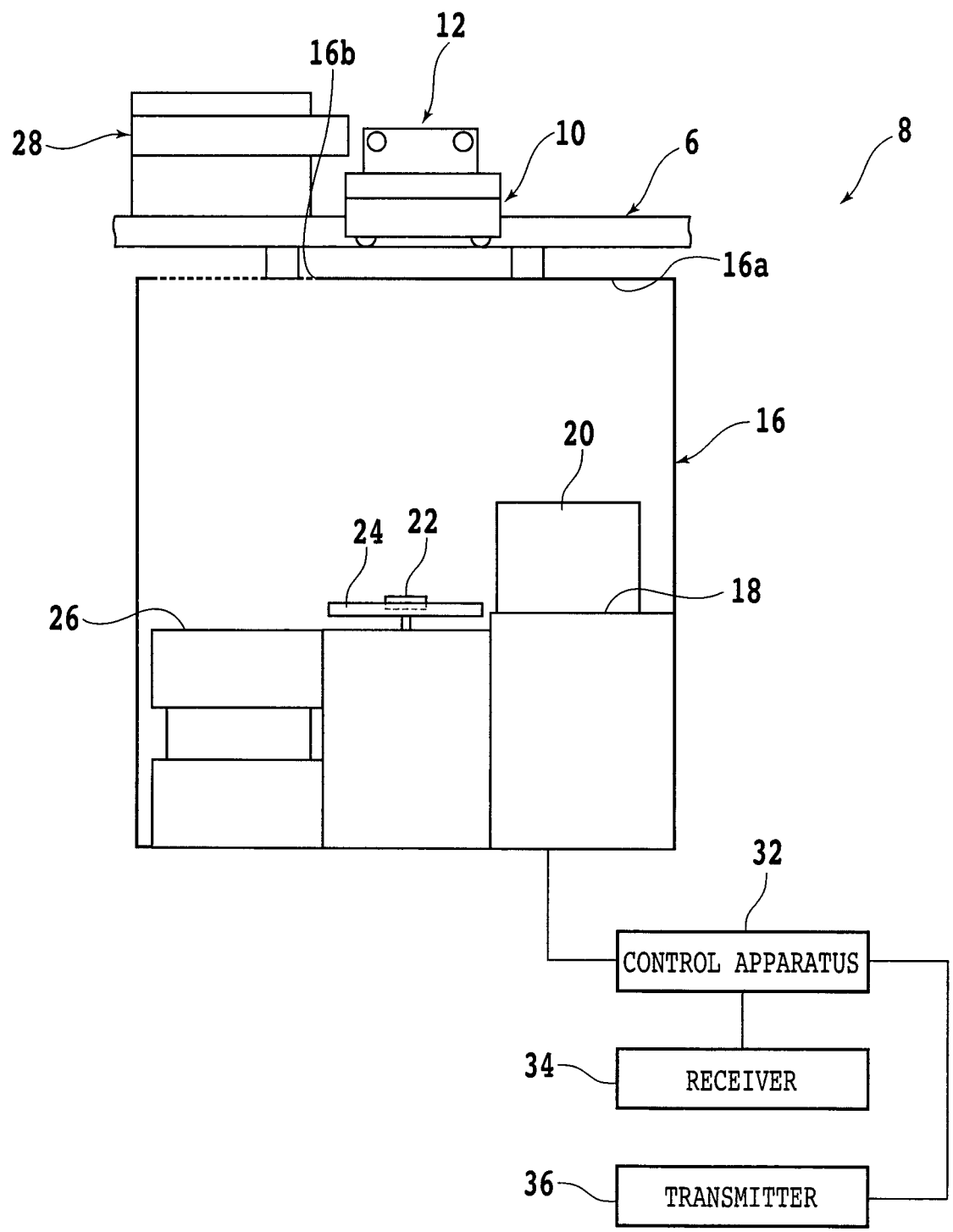
FIG. 3 is a side view schematically illustrating a configuration example of a stock unit according to embodiment 1.

FIG. 3 is a side view schematically illustrating a configuration example of the stock unit 8. As illustrated in FIG. 3, the stock unit 8 includes a casing 16 that houses various constituent elements. In this FIG. 3, only the contour of the casing 16 is illustrated for convenience of description.

In the casing 16, a cassette holding base 18 that moves up and down by a first raising-lowering mechanism (not illustrated) of a ball screw type is disposed, for example. A cassette (workpiece stocker) 20 that can house plural workpieces 11 is placed on the upper surface of the cassette holding base 18. This cassette 20 houses the workpieces 11 in the state of being supported by the frame 15 with the intermediary of the tape 13 as described above.

A push-pull arm 22 that can move while grasping the frame 15 is disposed on a lateral side of the cassette holding base 18. For example, when the height of the frame 15 housed in the cassette 20 is adjusted to the height of the push-pull arm 22 by the first raising-lowering mechanism and the frame 15 in the cassette 20 is grasped by this push-pull arm 22, the frame 15 can be drawn out to the outside of the cassette 20.

A pair of guide rails 24 made to get closer to and further away from each other while the state in which the guide rails 24 are parallel to each other is kept are disposed at positions that sandwich the push-pull arm 22. Each guide rail 24 includes a support surface that supports the frame 15 from the lower side and a side surface substantially perpendicular to the support surface. The guide rails 24 sandwich the frame 15 drawn out of the cassette 20 by the push-pull arm 22 and adjust the frame 15 to a predetermined position.

On a lateral side of the push-pull arm 22 and the pair of guide rails 24, a conveying vehicle holding base (storage member holding base) 26 that moves up and down by a second raising-lowering mechanism (not illustrated) of a ball screw type is disposed, for example. The automated workpiece conveying vehicle 10 that can house the workpiece 11 (frame 15) is placed on the upper surface of this conveying vehicle holding base 26.

The frame 15 adjusted to the predetermined position by the pair of guide rails 24 is grasped by the push-pull arm 22 again and is inserted from a lateral side into the automated workpiece conveying vehicle 10 on the conveying vehicle holding base 26 whose height is adjusted by the second raising-lowering mechanism. A fixing member (not illustrated) for fixing the automated workpiece conveying vehicle 10 is disposed on an upper surface of the conveying vehicle holding base 26. When a workpiece 11 is to be transferred from the cassette 20 that houses workpieces 11 therein to the automated workpiece conveying vehicle 10, the automated workpiece conveying vehicle 10 is positioned in a predetermined position determined by the fixing member on the conveying vehicle holding base 26.

The casing 16 has an opening 16b defined in a ceiling 16a thereof and extending vertically therethrough in a region directly above the conveying vehicle holding base 26. The opening 16b is of such a shape and size that allow at least the automated workpiece conveying vehicle 10 placed on the conveying vehicle holding base 26 to pass therethrough. The automated workpiece conveying vehicle 10 is conveyed from outside of the casing 16 into the casing 16 through the opening 16b or from inside of the casing 16 out of the casing 16 through the opening 16b.

Above the casing 16 of the stock unit 8, there is disposed a conveying unit support structure 28 for supporting the conveying unit 12 when the automated workpiece conveying vehicle 10 is conveyed between a region of the conveyance passage 6 above the stock unit 8 and the conveying vehicle holding base 26 of the stock unit 8. A control apparatus 32 for controlling operation of the stock unit 8 is connected to constituent elements such as the first raising-lowering mechanism, the push-pull arm 22, the pair of guide rails 24, and the second raising-lowering mechanism.

Typically, the control apparatus 32 is formed of a computer including a processing apparatus such as a central processing unit (CPU) and a storing apparatus such as a flash memory, and functions of the control apparatus 32 are implemented by causing the processing apparatus and so forth to operate in accordance with software stored in the storing apparatus.

A receiver 34 that receives a signal for control (control signal) transmitted from the control unit 14 of the conveyance system 2 and a transmitter 36 that transmits a signal for notification (notification signal) to the control unit 14 are further connected to the control apparatus 32. The control apparatus 32 controls the operation of the stock unit 8 based on the signal received by the receiver 34. Furthermore, the control apparatus 32 transmits the necessary signal to the control unit 14 through the transmitter 36.

Figure 4A:
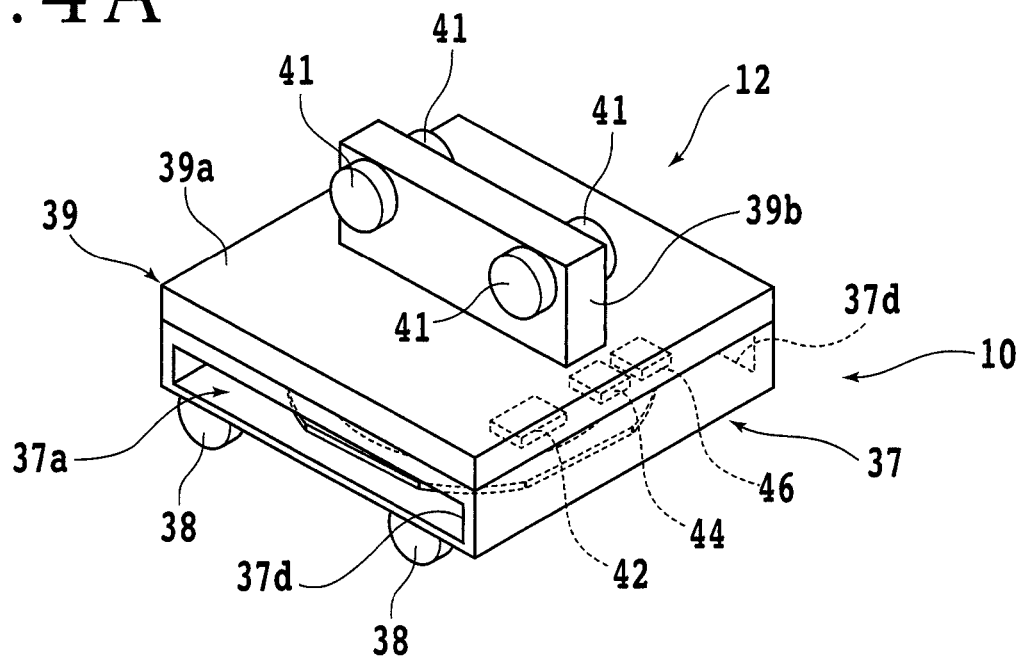
FIG. 4A is a perspective view illustrating a configuration example of an automated workpiece conveying vehicle and a conveying unit.
Figure 4B:
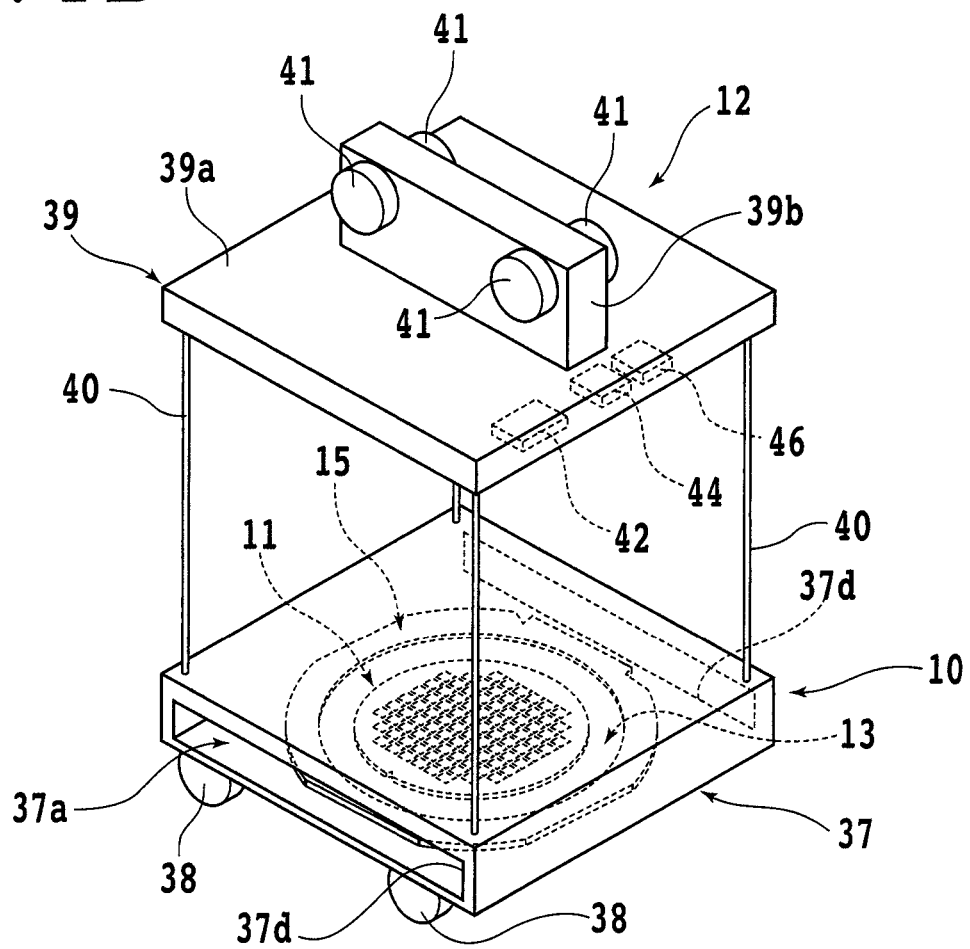
FIG. 4B is a perspective view illustrating how the automated workpiece conveying vehicle is conveyed by the conveying unit.

FIG. 4A is a perspective view illustrating a configuration example of the automated workpiece conveying vehicle 10 and the conveying unit 12. FIG. 4B is a perspective view illustrating how the automated workpiece conveying vehicle 10 is conveyed by the conveying unit 12. As illustrated in FIG. 4A, the automated workpiece conveying vehicle 10 includes a chassis (workpiece storage member) 37 shaped as a rectangular parallelepiped for storing one workpiece 11 (and a frame 15), for example.

The chassis 37 has a space 37a defined therein for storing the workpiece 11 (and the frame 15). The chassis 37 includes a pair of side walls having respective openings 37b defined therein that have a size large enough to allow the workpiece 11 (and the frame 15) to pass therethrough. The space 37a in the chassis 37 is open to the outside of the chassis 37 through the openings 37b. Therefore, the workpiece 11 (and the frame 15) can be loaded into the space 37a in the chassis 37 through the openings 37b and can be unloaded from the space 37a in the chassis 37 through the openings 37b. Plural (in the present embodiment, four) wheels (traveling mechanism) 38 are disposed on the lower surface side of the chassis 37. Each wheel 38 is coupled to a rotational drive source such as a motor and rotates. By rotating these wheels 38 by the rotational drive source, the automated workpiece conveying vehicle 10 travels on the conveyance passage 6 together with the conveying unit 12. As the wheels 38, what is called Mecanum wheels in which plural inclined barrel-shaped (cylinder-shaped) rotating bodies are attached to the outer circumferential surface in contact with the conveyance passage 6, or the like, can be used.

The conveying unit 12 includes an upper casing 39 disposed above the chassis 37. The upper casing 39 includes a base 39a shaped as a flat plate having a size that is about the same as the size of the chassis 37 as viewed in plan. A plurality of (four in the present embodiment) wires 40 are disposed on a lower surface of the base 39a in respective areas corresponding to the four corners of the base 39a. The automated workpiece conveying vehicle 10 and the conveying unit 12 are coupled to each other by the wires 40. The base 39a houses therein a winch (not illustrated) for winding up and down the wires 40.

While the base 39a of the conveying unit 12 is being supported so as to keep the chassis 37 of the automated workpiece conveying vehicle 10 floating, for example, when the winch is actuated to draw the wires 40 from the base 39a, the chassis 37 is lowered, as illustrated in FIG. 4B. When the winch is actuated to wind up the wires 40 into the base 39a, the chassis 37 is elevated.

A protrusive block 39b shaped as a rectangular parallelepiped is disposed on an upper surface of the base 39a. A plurality of (four in the present embodiment) wheels (traveling mechanisms) 41 are mounted on side surfaces of the protrusive block 39b. Each of the wheels 41 is coupled to a rotational drive source such as an electric motor or the like so as to be rotated by the rotational drive source. When the wheels 41 are placed on the conveying unit support structure 28 or the like and rotated by the rotational drive sources, the automated workpiece conveying vehicle 10 and the conveying unit 12 travel on the conveying unit support structure 28 or the like even if the wheels 38 of the automated workpiece conveying vehicle 10 are out of contact with the conveyance passage 6.

The base 39a also houses therein a control apparatus 42 for controlling operation of the automated workpiece conveying vehicle 10 and the conveying unit 12. Typically, the control apparatus 42 is formed of a computer including a processing apparatus such as a CPU and a storing apparatus such as a flash memory, and functions of the control apparatus 42 are implemented by causing the processing apparatus and so forth to operate in accordance with software stored in the storing apparatus.

To this control apparatus 42, a receiver 44 that receives a signal for control (control signal) transmitted from the control unit 14 of the conveyance system 2 and a transmitter 46 that transmits a signal for notification (notification signal) to the control unit 14 are connected. The control apparatus 42 controls operation of the automated workpiece conveying vehicle 10 and the conveying unit 12 on the basis of signals received by the receiver 44. Furthermore, the control apparatus 42 transmits the necessary signal to the control unit 14 through the transmitter 46.

According to the present embodiment, the control apparatus 42, the receiver 44, and the transmitter 46 are treated as constituent elements of the automated workpiece conveying vehicle 10 for convenience of explanation. However, the control apparatus 42, the receiver 44, and the transmitter 46 may be treated as constituent elements of the conveying unit 12. Alternatively, the control apparatus 42, the receiver 44, and the transmitter 46 may of course be treated as constituent elements common to the automated workpiece conveying vehicle 10 and the conveying unit 12.

A secondary battery, for example, is connected to the above constituent elements including the rotational drive sources, the winch, the control apparatus 42, the receiver 44, the transmitter 46, and so on. The constituent elements of the automated workpiece conveying vehicle 10 and the conveying unit 12 are actuated by electric power supplied from the secondary battery. The secondary battery should desirably be supplied (charged) with electric power by a non-contact (wireless or contactless) system. However, the secondary battery may be charged by a contact system.

An electrode 39c (see FIG. 12) for contacting the conveying unit support structure 28 or the like is disposed on the protrusive block 39b. Some or all of the constituent elements of the automated workpiece conveying vehicle 10 and the conveying unit 12 can be supplied with electric power from an external source through the electrode 39c. Therefore, when the rotational drive sources, the winch, etc. of the conveying unit 12, which tend to consume a large amount of electric power, are actuated by the electric power supplied from the external source, for example, the secondary battery is restrained from being unduly discharged, allowing the automated workpiece conveying vehicle 10 and so on to be operated for a long period of time. In addition, the secondary battery may be charged by the electric power supplied through the electrode 39c.

Figure 5:
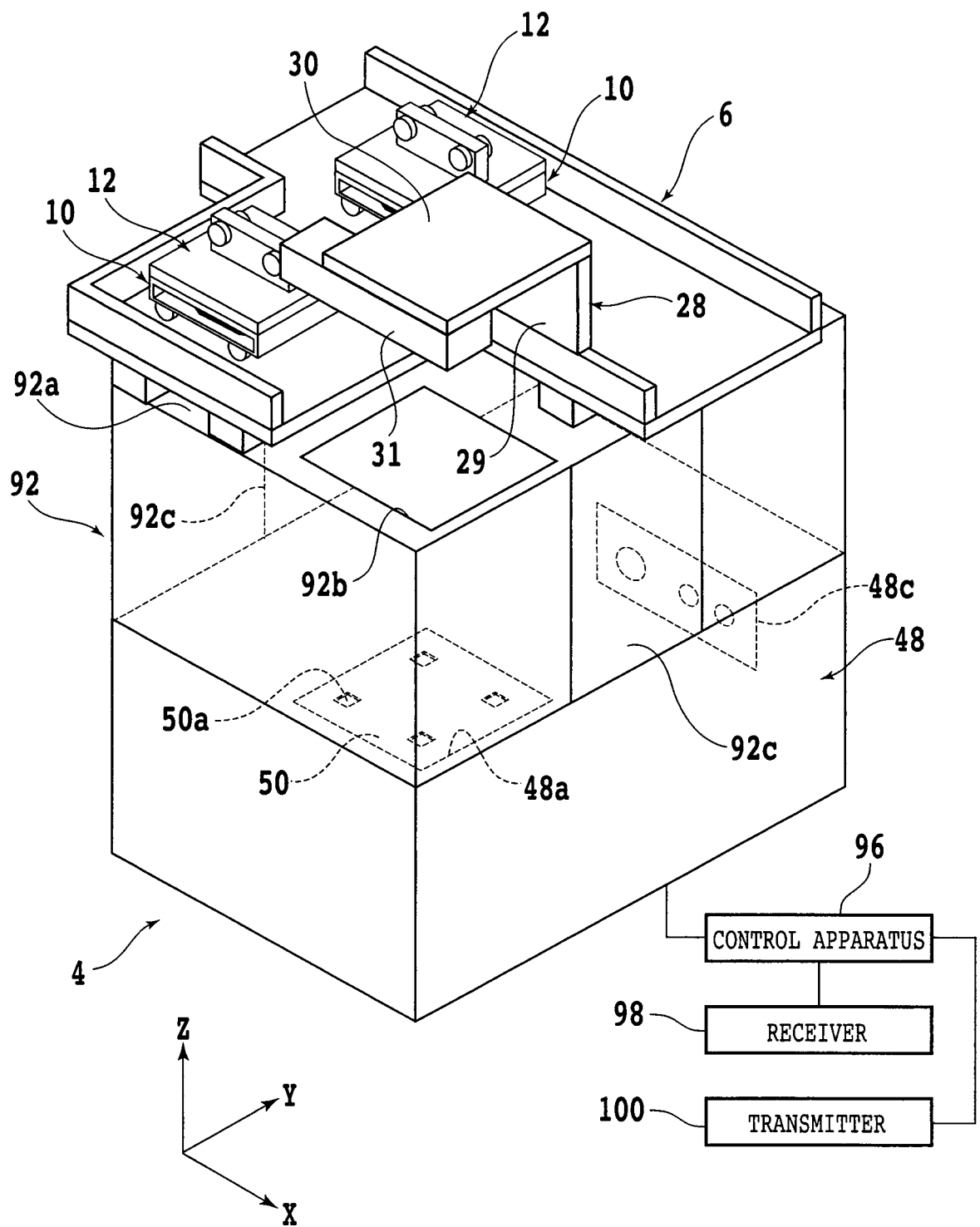
FIG. 5 is a perspective view illustrating the appearance of a cutting apparatus, a conveyance passage, and so forth according to embodiment 1.
Figure 6:
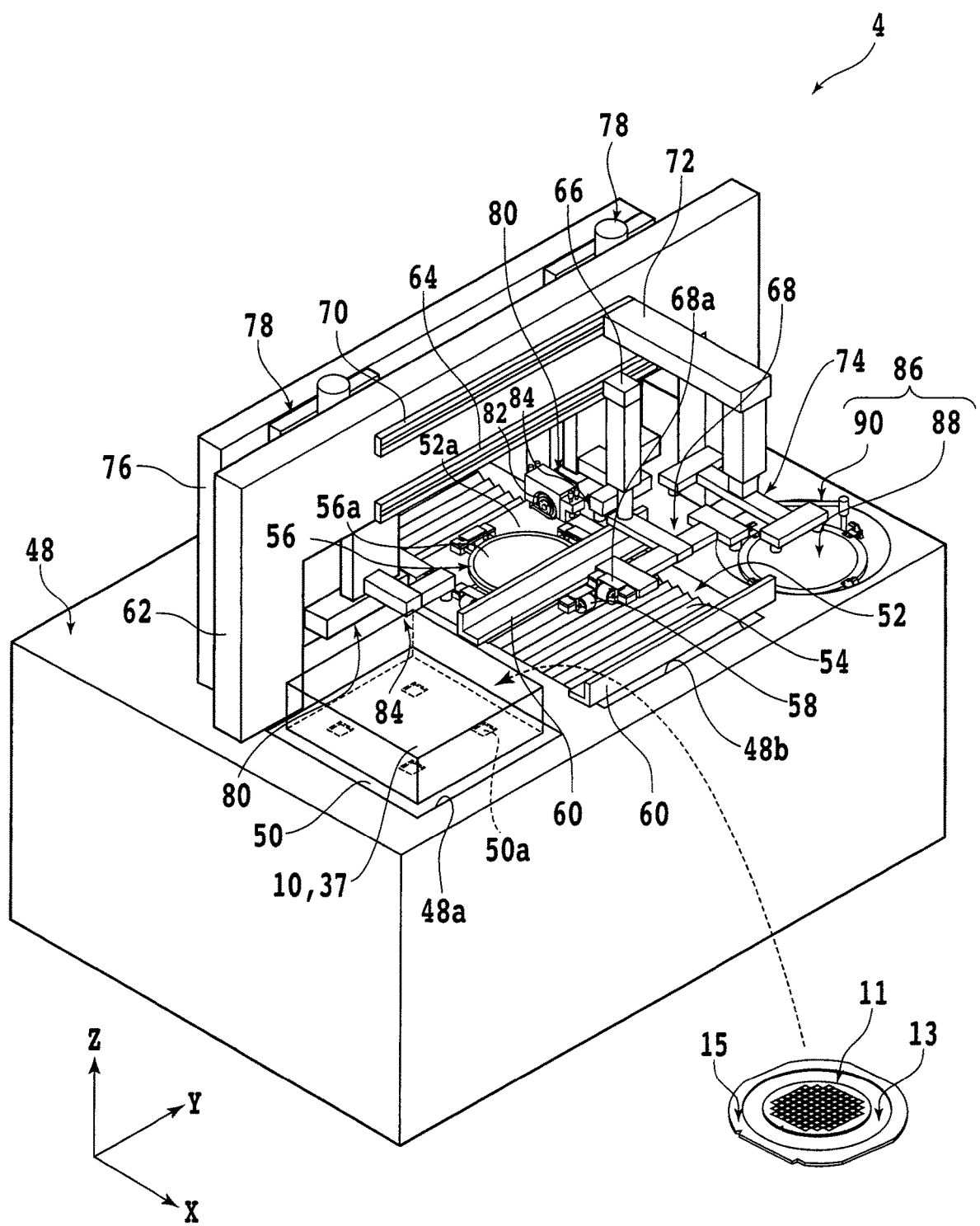
FIG. 6 is a perspective view illustrating a configuration example of the cutting apparatus.

FIG. 5 is a perspective view illustrating the appearance of the cutting apparatus 4, the conveyance passage 6, and so forth and FIG. 6 is a perspective view illustrating a configuration example of the cutting apparatus 4. As illustrated in FIG. 5 and FIG. 6, the cutting apparatus 4 includes a pedestal 48 that supports the respective constituent elements. The pedestal 48 has an opening 48a defined in a corner thereof, and a conveying vehicle holding base (storage member holding base) 50 that can be raised and lowered by a lifting and lowering mechanism (not illustrated).

The chassis 37 of the automated workpiece conveying vehicle 10 is placed on an upper surface of the conveying vehicle holding base 50. The upper surface of the conveying vehicle holding base 50 has wheel stops 50a for securing the wheels 38 of the automated workpiece conveying vehicle 10. The chassis 37 on the conveying vehicle holding base 50 is positioned in a predetermined position determined by the wheel stops 50a.

As illustrated in FIG. 6, an opening 48b that is long in an X-axis direction (front-rear direction, processing feed direction) is formed on a lateral side of the opening 48a. An X-axis movement mechanism (processing feed unit) 52 of a ball screw type and a dust-proof and drip-proof cover 54 that covers the upper part of the X-axis movement mechanism 52 are disposed in the opening 48b. The X-axis movement mechanism 52 includes an X-axis movement table 52a and moves this X-axis movement table 52a in the X-axis direction.

A chuck table (holding table) 56 that sucks and holds the workpiece 11 is disposed on the X-axis movement table 52a. The chuck table 56 is coupled to a rotational drive source (not illustrated) such as a motor and rotates around a rotation axis substantially parallel to a Z-axis direction (vertical direction, cutting-in feed direction). Furthermore, the chuck table 56 moves in the X-axis direction (processing feed) by the above-described X-axis movement mechanism 52.

The upper surface of the chuck table 56 functions as a holding surface 56a for holding the workpiece 11. The holding surface 56a is connected to a suction source (not illustrated) through a suction path (not illustrated) formed inside the chuck table 56 and so forth. Furthermore, four clamps 58 for fixing the frame 15 that supports the workpiece 11 from four sides are disposed around the chuck table 56.

Above the opening 48b, a pair of guide rails (temporary putting region) 60 made to get closer to and further away from each other while the state in which the guide rails 60 are parallel to a Y-axis direction (right-left direction, indexing feed direction) is kept are disposed. The pair of guide rails 60 each include a support surface that supports the frame 15 from the lower side and a side surface substantially perpendicular to the support surface. The guide rails 60 sandwich the frame 15 drawn out of the chassis 37 in the X-axis direction and adjust the frame 15 to a predetermined position.

A first support structure 62 with a gate shape is disposed to straddle the opening 48b over the pedestal 48. A first rail 64 along the Y-axis direction is fixed to the front surface of the first support structure 62 (surface on the side of the guide rails 60) and a first holding unit 68 is coupled to this first rail 64 with the intermediary of a first movement mechanism 66 and so forth.

For example, the first holding unit 68 gets contact with the upper surface of the frame 15 to suck and hold this frame 15 and moves up and down by the first movement mechanism 66. In addition, the first holding 68 moves in the Y-axis direction along the first rail 64. A grasping mechanism 68a for grasping the frame 15 is disposed on the first holding unit 68 on the side of the opening 48a.

For example, when the frame 15 is grasped by the grasping mechanism 68a and the first holding unit 68 is moved in the Y-axis direction, the frame 15 in the chassis 37 can be drawn out to the pair of guide rails 60 or the frame 15 on the pair of guide rails 60 can be inserted into the chassis 37. After the position of the frame 15 is adjusted by the pair of guide rails 60, this frame 15 (workpiece 11) is sucked and held by the first holding unit 68 and is carried in to the chuck table 56.

Furthermore, on the front surface of the first support structure 62, a second rail 70 along the Y-axis direction is fixed to the upper side of the first rail 64. A second holding unit 74 is coupled to this second rail 70 with the intermediary of a second movement mechanism 72 and so forth. For example, the second holding unit 74 gets contact with the upper surface of the frame 15 to suck and hold this frame 15 and moves up and down by the second movement mechanism 72. In addition, the second holding unit 74 moves in the Y-axis direction along the second rail 70.

A second support structure 76 with a gate shape is disposed on the rear side of the first support structure 62. Two sets of cutting units (processing units) 80 are each disposed on the front surface of the second support structure 76 (surface on the side of the first support structure 62) with the intermediary of a Y-axis/Z-axis movement mechanism (indexing feed unit, cutting-in feed unit) 78. The cutting unit 80 each moves in the Y-axis direction (indexing feed) and moves in the Z-axis direction (cutting-in feed) by the corresponding Y-axis/Z-axis movement mechanism 78.

Each cutting unit 80 includes a spindle (not illustrated) that serves as a rotating shaft substantially parallel to the Y-axis direction. A cutting blade 82 with a circular ring shape is mounted to one end side of each spindle. A rotational drive source (not illustrated) such as a motor is coupled to the other end side of each spindle. Furthermore, a nozzle for supplying a cutting liquid such as purified water to the workpiece 11 and the cutting blade 82 is disposed near the cutting blade 82.

While the cutting liquid is supplied from this nozzle, the rotated cutting blade 82 is caused to cut into the workpiece 11 held by the chuck table 56. Thereby, the workpiece 11 can be cut. An imaging unit (camera) 84 for imaging the workpiece 11 held by the chuck table 56 and so forth is disposed at a position adjacent to the cutting unit 80. This imaging unit 84 also moves in the Y-axis direction and moves in the Z-axis direction by the Y-axis/Z-axis movement mechanism 78.

A cleaning unit 86 is disposed at a position on the opposite side to the opening 48a across the opening 48b. The cleaning unit 86 includes a spinner table 88 that sucks and holds the workpiece 11 in a cleaning space with a cylindrical shape. A rotational drive source (not illustrated) that rotates the spinner table 88 at a predetermined speed is coupled to the lower part of the spinner table 88.

A spray nozzle 90 that sprays a fluid for cleaning (typically, mixed fluid obtained by mixing water and air) toward the workpiece 11 held by the spinner table 88 is disposed above the spinner table 88. The workpiece 11 can be cleaned by rotating the spinner table 88 that holds the workpiece 11 and spraying the fluid for cleaning from the spray nozzle 90.

After the workpiece 11 is cut by the cutting unit 80, the frame 15 is sucked and held by the second holding unit 74 and is conveyed to the cleaning unit 86, for example. After the workpiece 11 is cleaned by the cleaning unit 86, for example, the frame 15 is sucked and held by the first holding unit 68 to be placed on the pair of guide rails 60, and thereafter this frame 15 is grasped by the grasping mechanism 68a and is housed in the chassis 37.

As illustrated in FIG. 5, the upper surface side of the pedestal 48 is covered by a cover 92 and the above-described respective constituent elements are housed inside the cover 92. An opening 92b that vertically penetrates a ceiling 92a of the cover 92 is made in a region directly above the opening 48a. The chassis 37 of the automated workpiece conveying vehicle 10 is conveyed from outside of the cover 92 into the cover 92 through the opening 92b or from inside of the cover 92 out of the cover 92 through the opening 92b. The opening 92b is not limited to any particular shape and size, but needs to be shaped and sized to allow at least the chassis 37 to pass therethrough.

The conveying unit support structure 28 is disposed above the cover 92 of the cutting apparatus 4. The conveying unit support structure 28 includes, for example, a support structure 29 having a lower end fixed to the conveyance passage 6 (or the cutting apparatus 4), and a support plate 30 shaped as a flat plate extending along the X-axis and Y-axis directions and having an end fixed to an upper end of the support structure 29. A guide rail 31 extending along the X-axis direction is disposed on a lower surface of the support plate 30 at the other end side thereof. The structural details and layout of the conveying unit support structure 28 may be changed arbitrarily depending on the structural details of the cutting apparatus 4 and the layout of the conveyance passage 6.

The guide rail 31 includes on its lower end a pair of flat support members 31a (see FIG. 13A, etc.) spaced from each other in the Y-axis direction. The gap between the pair of support members 31a is set to a value depending on the distance between the wheels 41 of the conveying unit 12 (the thickness of the protrusive block 39b). When the automated workpiece conveying vehicle 10 and the conveying unit 12 are moved in the X-axis direction in a manner to insert the protrusive block 39b into the gap, for example, the wheels 41 of the conveying unit 12 ride onto respective upper surfaces of the support members 31a. As a result, the conveying unit 12 is supported by the conveying unit support structure 28.

When the wheels 41 are rotated while the conveying unit 12 is being supported by the conveying unit support structure 28, the conveying unit 12 moves along the guide rail 31. Specifically, as the conveying unit 12 is thus used in combination with the conveying unit support structure 28, the automated workpiece conveying vehicle 10 and the conveying unit 12 can be moved along the guide rail 31 even if the wheels 38 of the automated workpiece conveying vehicle 10 are out of contact with the conveyance passage 6.

Consequently, after the chassis 37 of the automated workpiece conveying vehicle 10 has been moved to a position directly above the opening 92b by the conveying unit 12, for example, when the wires 40 are drawn from the base 39a to lower the chassis 37, the chassis 37 can be placed on the conveying vehicle holding base 50. Furthermore, after the chassis 37 has been lifted from the conveying vehicle holding base 50 by pulling the wires 40 back into the base 39a, when the chassis 37 is moved by the conveying unit 12 to bring the wheels 38 into contact with the conveyance passage 6, the automated workpiece conveying vehicle 10 can be self-propelled by the wheels 38.

The conveying unit support structure 28 thus supports the conveying unit 12 when the chassis 37 of the automated workpiece conveying vehicle 10 is conveyed between a region of the conveyance passage 6 above the cutting apparatus 4 and the conveying vehicle holding base 50 of the cutting apparatus 4. The conveying unit support structure 28 included in the stock unit 8 may have structural details identical to those of the conveying unit support structure 28 included in the cutting apparatus 4.

The constituent elements of the cutting apparatus 4 described above are connected to a control apparatus 96 (FIG. 5). Typically, the control apparatus 96 is formed of a computer including a processing apparatus such as a CPU and a storing apparatus such as a flash memory, and functions of the control apparatus 96 are implemented by causing the processing apparatus and so forth to operate in accordance with software stored in the storing apparatus.

A receiver 98 that receives a signal for control (control signal) transmitted from the control unit 14 of the conveyance system 2 and a transmitter 100 that transmits a signal for notification (notification signal) to the control unit 14 are further connected to the control apparatus 96. The control apparatus 96 controls the respective constituent elements of the above-described cutting apparatus 4 based on the signal received by the receiver 98 and so forth, for example.

A conduit connecting part 48c (FIG. 5) to which various conduits 21 are connected is disposed in a sidewall of the pedestal 48. Furthermore, doors 92c (FIG. 5) opened and closed in maintenance or the like are disposed in a sidewall of the cover 92. Moreover, an operation panel (not illustrated), a display (not illustrated), and so forth may be disposed on a sidewall of the cover 92.

Figure 7:
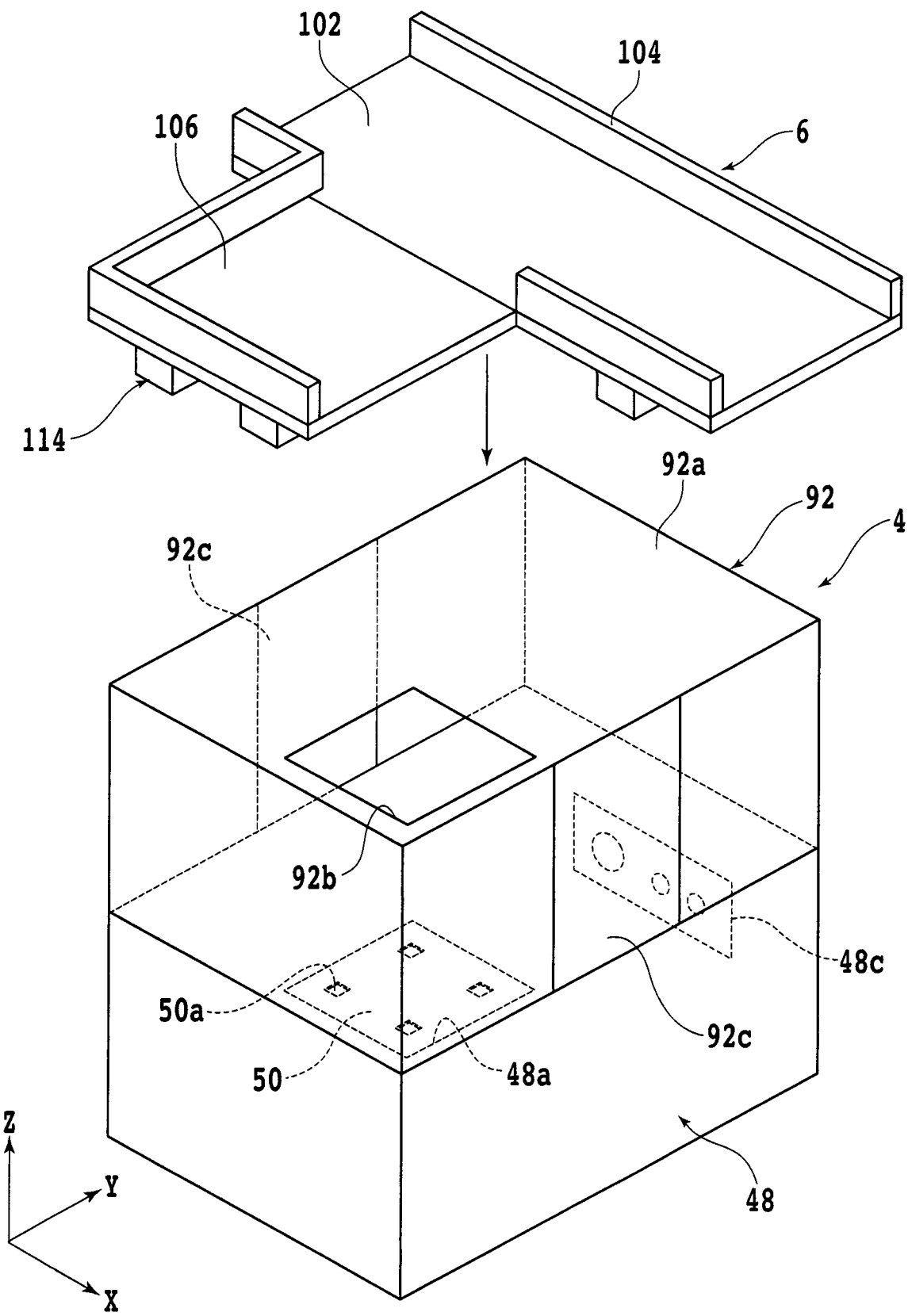
FIG. 7 is a perspective view illustrating how the conveyance passage is set on the cutting apparatus.

FIG. 7 is a perspective view illustrating how the conveyance passage 6 of the conveyance system 2 is set on the cutting apparatus 4. As illustrated in FIG. 7 and so forth, the conveyance passage 6 of the conveyance system 2 according to the present embodiment is mounted to the upper surface side of the ceiling 92a of the cover 92 which the cutting apparatus 4 has. That is, the conveyance passage 6 is set in a space directly above the cutting apparatus 4.

This eliminates interference of the conveyance passage 6 with the structures such as the conduit connecting part 48c and the doors 92c disposed in side surfaces of the cutting apparatus 4. That is, the structures of the side surfaces of the cutting apparatus 4 do not need to be considered when the conveyance passage 6 is designed. For this reason, construction of the conveyance system 2 becomes easy.

Figure 8A:
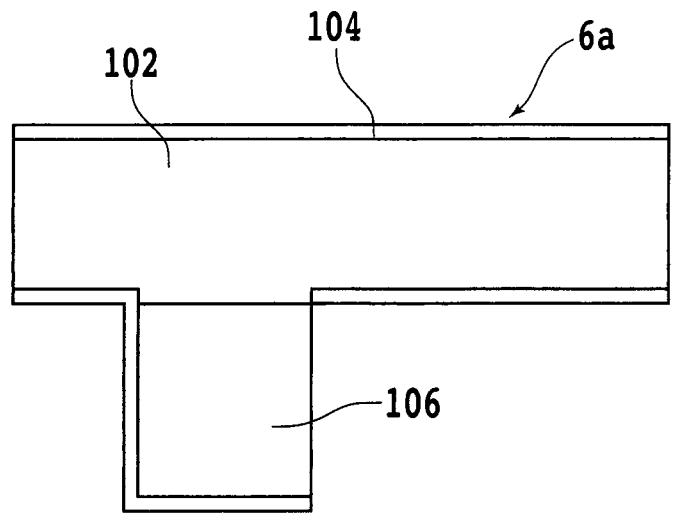
FIG. 8A, FIG. 8B, and FIG. 8C are plan views illustrating configuration examples of a passage module.
Figure 8B:
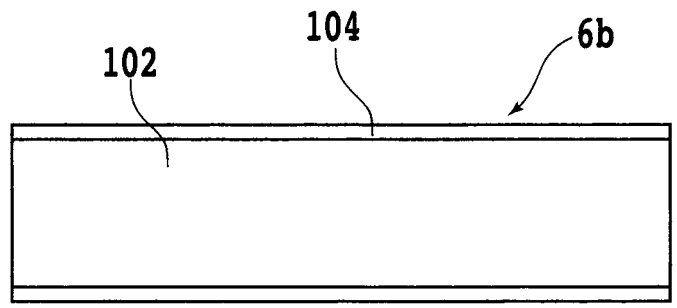
Figure 8C:
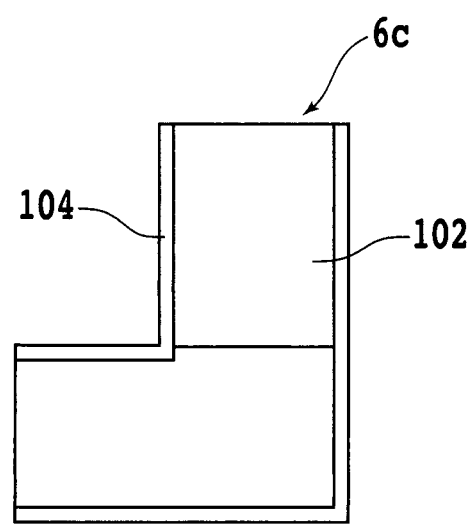

FIG. 8A is a plan view illustrating a configuration example of a passage module 6a used for the conveyance passage 6. FIG. 8B is a plan view illustrating a configuration example of a passage module 6b. FIG. 8C is a plan view illustrating a configuration example of a passage module 6c. The conveyance passage 6 is configured by combining the plural passage modules 6a, 6b, and 6c illustrated in FIG. 8A, FIG. 8B, and FIG. 8C, for example.

The respective passage modules 6a, 6b, and 6c each include a passage part 102 having an upper surface that is suitable for traveling of the automated workpiece conveying vehicle 10 and has high flatness and a guide part 104 that is disposed at ends of the passage part 102 in the width direction and is along this passage part 102. The height of the upper end of the guide part 104 from the passage part 102 is higher than the height of the wheels 38 of the automated workpiece conveying vehicle 10, for example. This can prevent the automated workpiece conveying vehicle 10 that travels on the passage part 102 from falling off from the passage part 102.

The passage module 6a of FIG. 8A further has a waiting part 106 for allowing the automated workpiece conveying vehicle 10 to wait, and is set directly above the cutting apparatus 4 or the like, for example. An electric power supply facility (electric charger) for supplying electric power to the secondary battery of the automated workpiece conveying vehicle 10 may be disposed on the waiting part 106 or the like. Meanwhile, the passage module 6b of FIG. 8B is formed into a straight line shape and the passage module 6c of FIG. 8C is formed into a right-angle shape suitable for a corner.

The passage modules 6b and 6c are used to join adjacent two passage modules 6a, for example. However, there is no limit to the kind, quantity, arrangement (relationship of the connection), and so forth of the passage module configuring the conveyance passage 6. For example, two passage modules 6a may be joined by yet another passage module 6a. Furthermore, for example, it is also possible to use a passage module with a circular arc shape (curved shape) instead of the passage module 6c with the right-angle shape.

Figure 9:
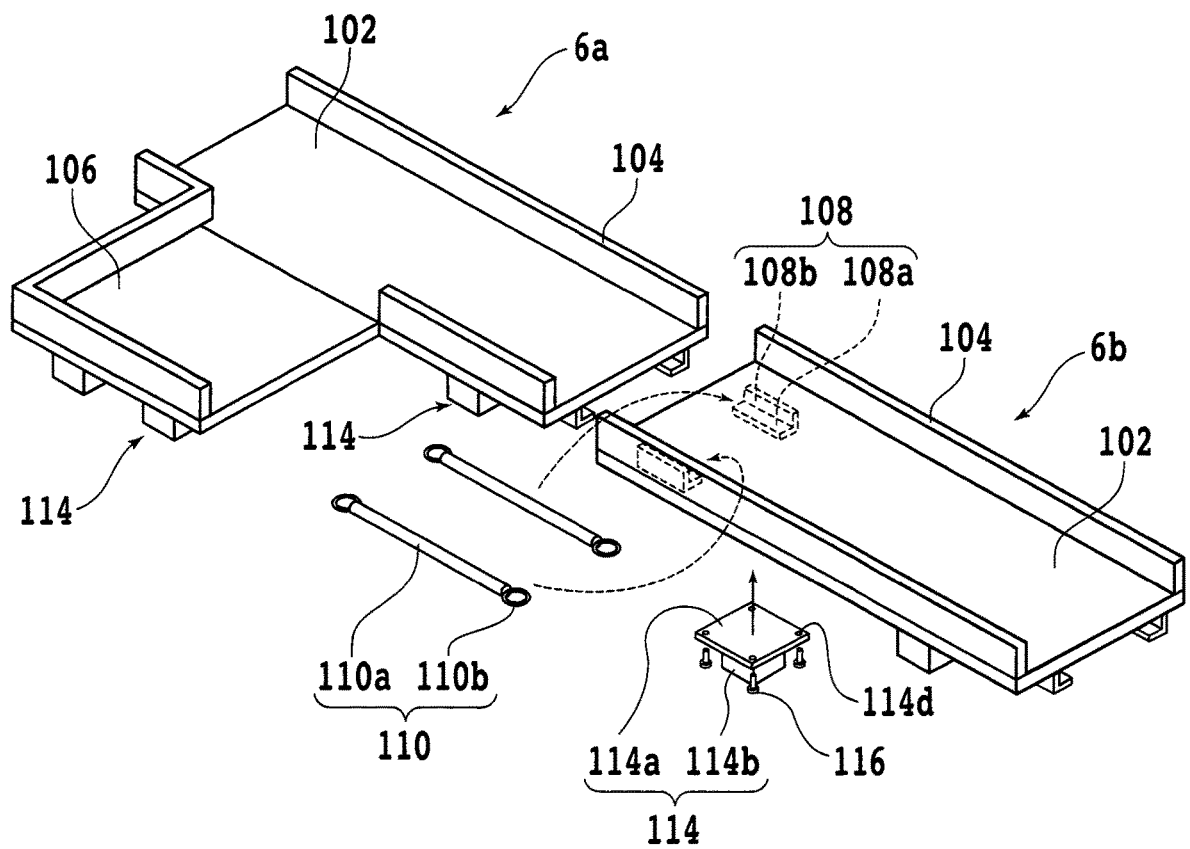
FIG. 9 is a perspective view illustrating how the conveyance passage is formed from the passage modules.
Figure 10A:
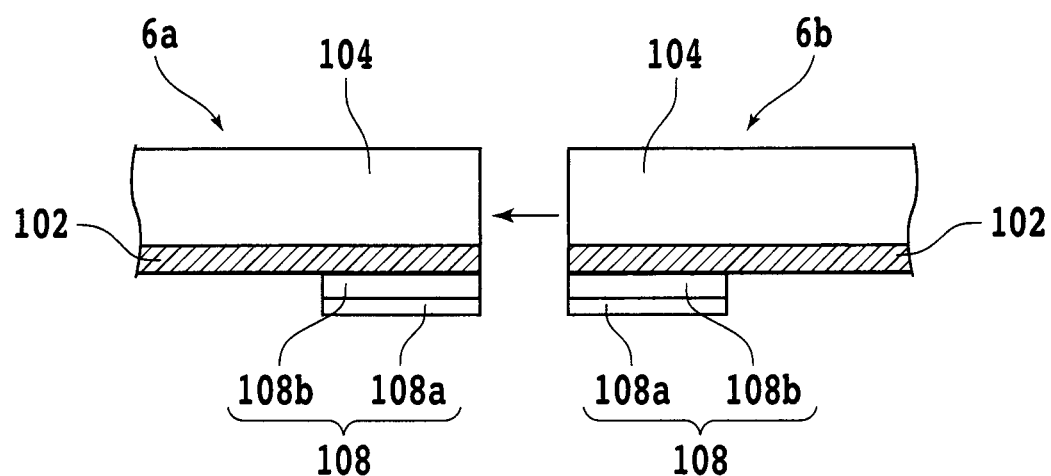
FIG. 10A and FIG. 10B are sectional views illustrating how the passage modules are coupled.
Figure 10B:
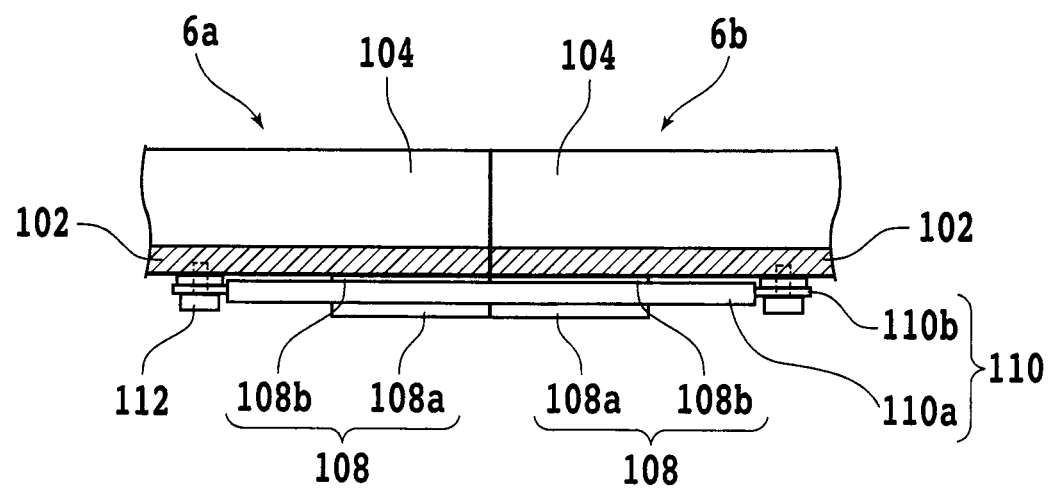
Figure 11:
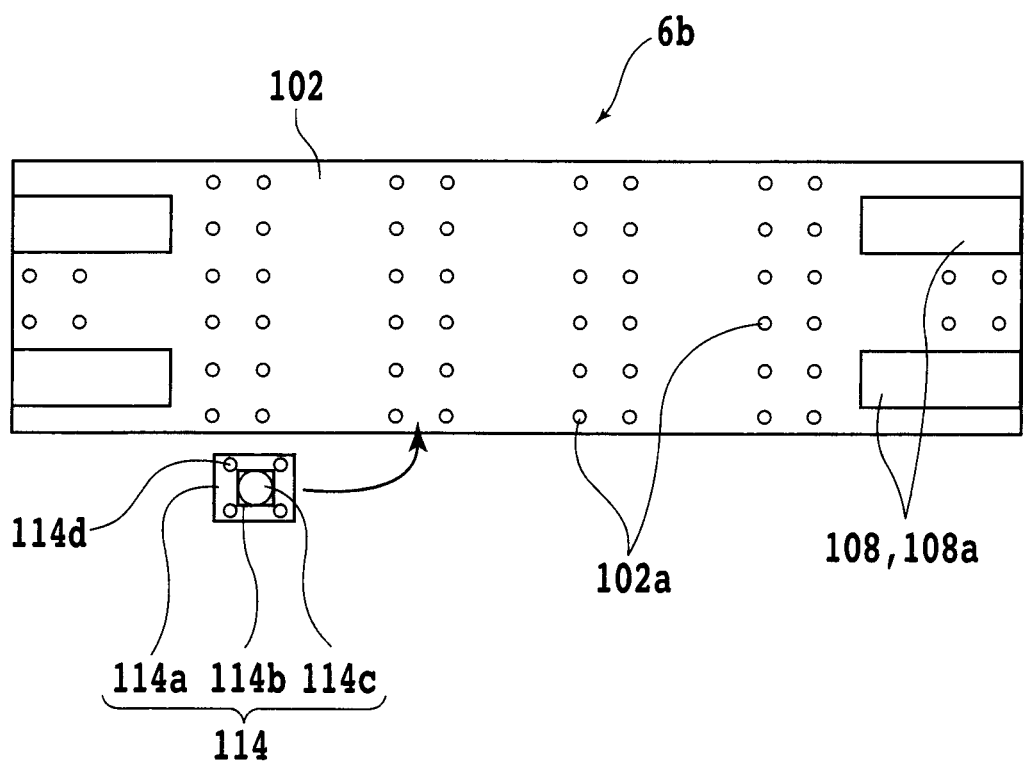
FIG. 11 is a bottom view illustrating a configuration example of the passage module.

FIG. 9 is a perspective view illustrating how the conveyance passage 6 is formed from the passage module 6a and the passage module 6b. FIG. 10A and FIG. 10B are sectional views illustrating how the passage module 6a and the passage module 6b are coupled. Furthermore, FIG. 11 is a bottom view illustrating a configuration example of the passage module 6b.

As illustrated in FIG. 9, a pair of angles (brackets) 108 whose section has an L-shape are disposed at an end part of the lower surface of the passage part 102 in the length direction (end part in the direction along the conveyance passage 6). Each angle 108 includes a substantially-horizontal support surface 108a and a side surface 108b substantially perpendicular to the support surface 108a, and is fixed to the lower surface of the passage part 102 in such a manner that the longitudinal direction of each angle 108 is along the conveyance passage 6.

When the passage module 6a and the passage module 6b are coupled, first, as illustrated in FIG. 10A, an end part of the passage part 102 configuring the passage module 6a in the longitudinal direction and an end part of the passage part 102 configuring the passage module 6b in the longitudinal direction are brought sufficiently close to each other. Then, as illustrated in FIG. 10B, coupling pieces 110 are each inserted into the angle 108 disposed on the passage part 102 configuring the passage module 6a and the angle 108 disposed on the passage part 102 configuring the passage module 6b.

For example, the coupling piece 110 includes a rod part 110a longer than the length obtained by adding the length of the angle 108 of the passage module 6a and the length of the angle 108 of the passage module 6b and ring parts 110b that are disposed at both ends of the rod part 110a and have an opening at the center. The rod parts 110a of these coupling pieces 110 are inserted into the angles 108.

After the rod parts 110a are inserted into the angles 108, bolts 112 are fastened into bolt holes (not illustrated) on the lower surface side of the passage part 102 through the openings of the ring parts 110b. This can couple the passage module 6a and the passage module 6b through the coupling pieces 110. The passage module 6c is also coupled to other passage modules (passage module 6a, passage module 6b, and so forth) by the same procedure.

Mounting of the passage modules 6a, 6b, and 6c to the cutting apparatus 4 is executed with the intermediary of a leg member 114 illustrated in FIG. 9, FIG. 11, and so forth, for example. The leg member 114 includes a plate-shaped base part 114a, a column part 114b that protrudes from the vicinity of the center of a surface of the base part 114a on one side and has a column shape, and a suction adhesion part 114c (FIG. 11) that is mounted to the tip of the column part 114b and has a suction cup shape.

In a region that does not overlap with the column part 114b in the base part 114a, four openings 114d that penetrate this base part 114a in the thickness direction are formed. Furthermore, in the lower surfaces of the passage parts 102 configuring the passage modules 6a, 6b, and 6c, bolt holes 102a (FIG. 11) corresponding to the respective openings 114d are formed.

Thus, when the surface of the base part 114a on the other side is brought into contact with the lower surface of the passage part 102 and bolts 116 are fastened into the bolt holes 102a through the openings 114d, the leg member 114 can be fixed to the passage module 6a, 6b, or 6c. There is no limit to the quantity, arrangement, and so forth of the openings 114d and the bolt holes 102a.

As illustrated in FIG. 11, four bolt holes 102a corresponding to four openings 114d of the base part 114a are formed in each of plural regions of the lower surface of the passage part 102 in the passage module 6b of the present embodiment, and the leg member 114 can be mounted to an arbitrary region. This is similar also to the other passage modules 6a and 6c.

That is, the leg member 114 is mounted to any region selected from the plural regions of the lower surface of the passage part 102. It is desirable to mount plural leg members 114 to each of the passage modules 6a, 6b, and 6c. This makes it easy to stabilize the position of the conveyance passage 6 relative to the cutting apparatus 4.

When the passage module 6a, 6b, or 6c is mounted to the cutting apparatus 4, for example, the position of the passage module 6a, 6b, or 6c is adjusted to the cover 92 of the cutting apparatus 4 and the suction adhesion parts 114c of the leg members 114 are pressed against the upper surface of the ceiling 92a of the cover 92 as illustrated in FIG. 7. This can cause the suction adhesion parts 114c to adhere to the upper surface of the ceiling 92a of the cover 92 by suction and mount the arbitrary passage module 6a, 6b, or 6c to the cover 92. That is, the arbitrary passage module 6a, 6b, or 6c is mounted to the cover 92 of the cutting apparatus 4 with the intermediary of the leg members 114.

All the passage modules 6a, 6b, and 6c do not necessarily have to be mounted to the cutting apparatus 4. For example, the passage module located between two cutting apparatuses 4 is often supported by only the passage module adjacent with the intermediary of the coupling piece 110. Furthermore, as illustrated in FIG. 1, an information providing part 102b such as an identification code typified by a two-dimensional code or a wireless tag is set on the passage part 102 of the passage module mounted to the cutting apparatus 4, the stock unit 8, or the like. The information provided by the information providing part 102b is used for a check of the position of the automated workpiece conveying vehicle 10 and so forth, for example.

Figure 12A:
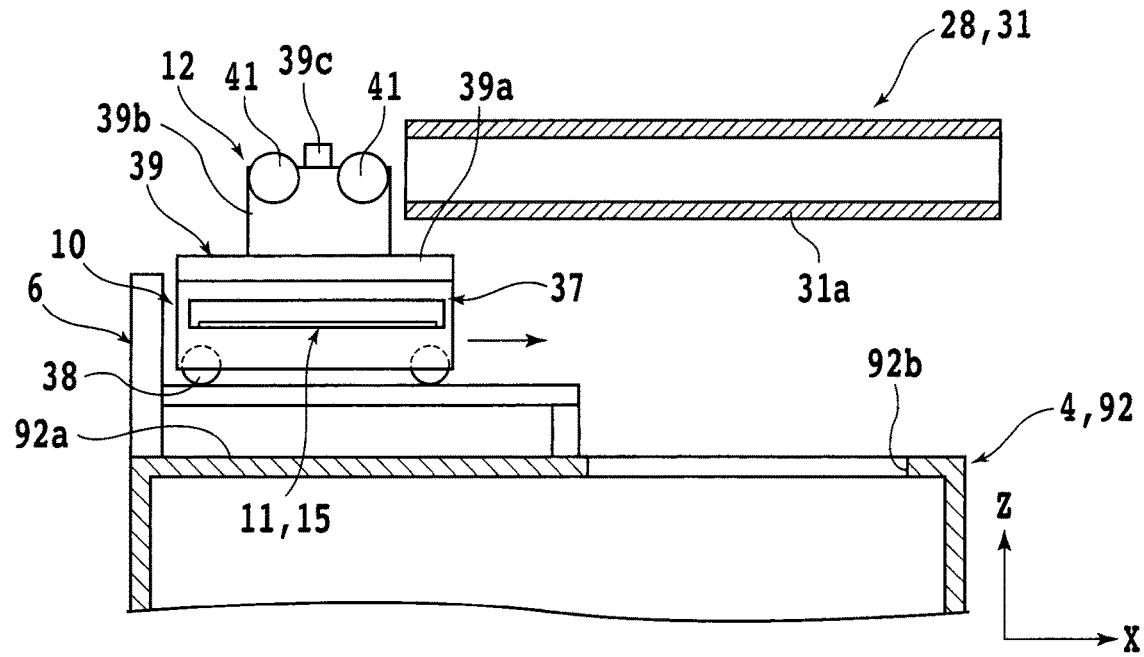
FIG. 12A is a side elevational view, partly in cross section, illustrating how the conveying unit is to be supported on a guide rail, as viewed from a Y-axis direction.

Next, operation of the chassis 37 of the automated workpiece conveying vehicle 10 as it is conveyed between the region of the conveyance passage 6 above the cutting apparatus 4 and the conveying vehicle holding base 50 of the cutting apparatus 4 will be described in detail below. FIG. 12A is a side elevational view, partly in cross section, illustrating how the conveying unit 12 is to be supported on the guide rail 31, as viewed from the Y-axis direction, and FIG. 12B is a side elevational view, partly in cross section, illustrating how the conveying unit 12 lowers the chassis 37, as viewed from the Y-axis direction.

Figure 12B:
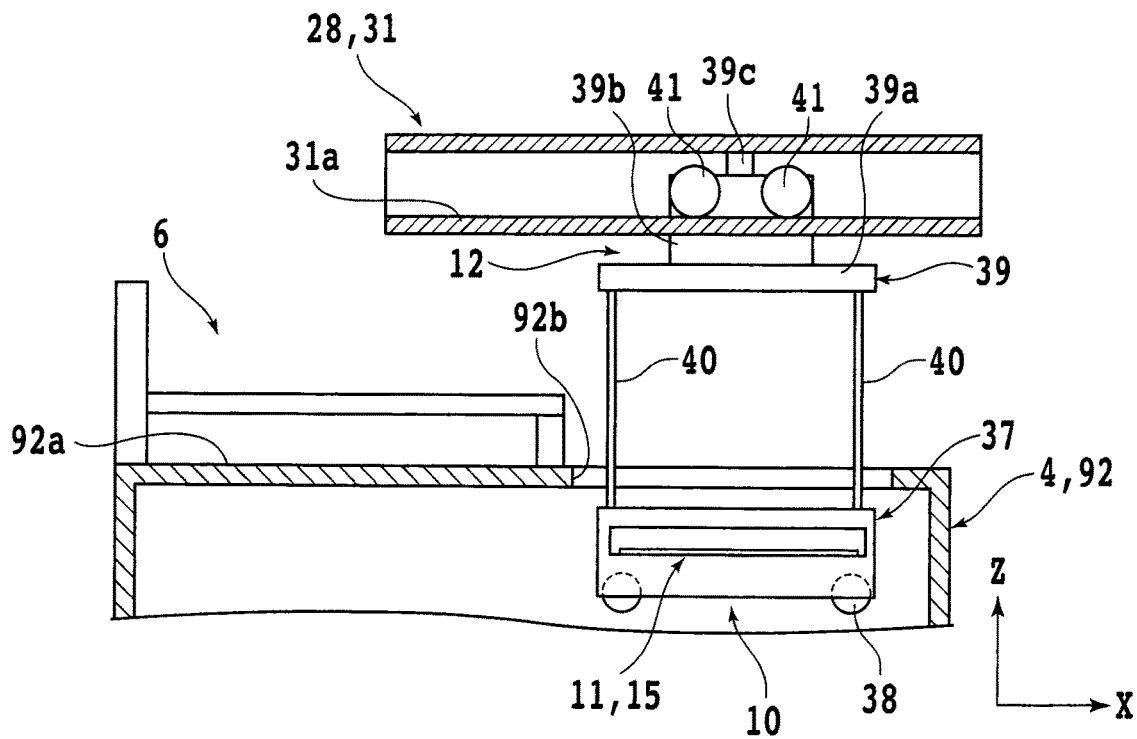
FIG. 12B is a side elevational view, partly in cross section, illustrating how the conveying unit lowers a chassis, as viewed from the Y-axis direction.
Figure 13A:
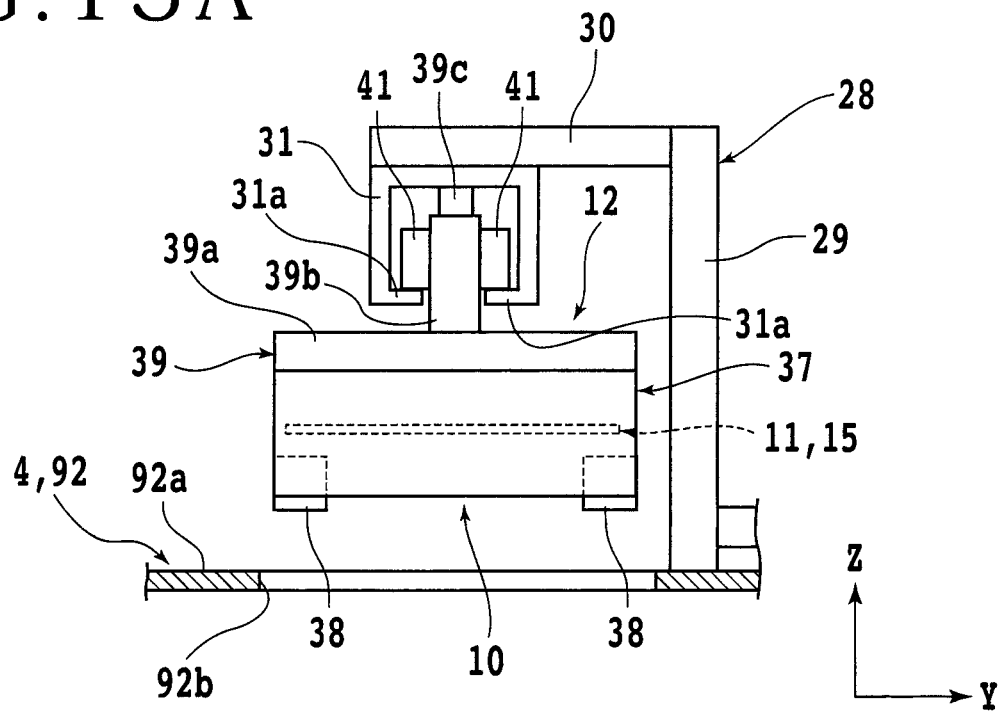
FIG. 13A is a side elevational view, partly in cross section, illustrating the state of FIG. 12A as viewed from an X-axis direction.
Figure 13B:
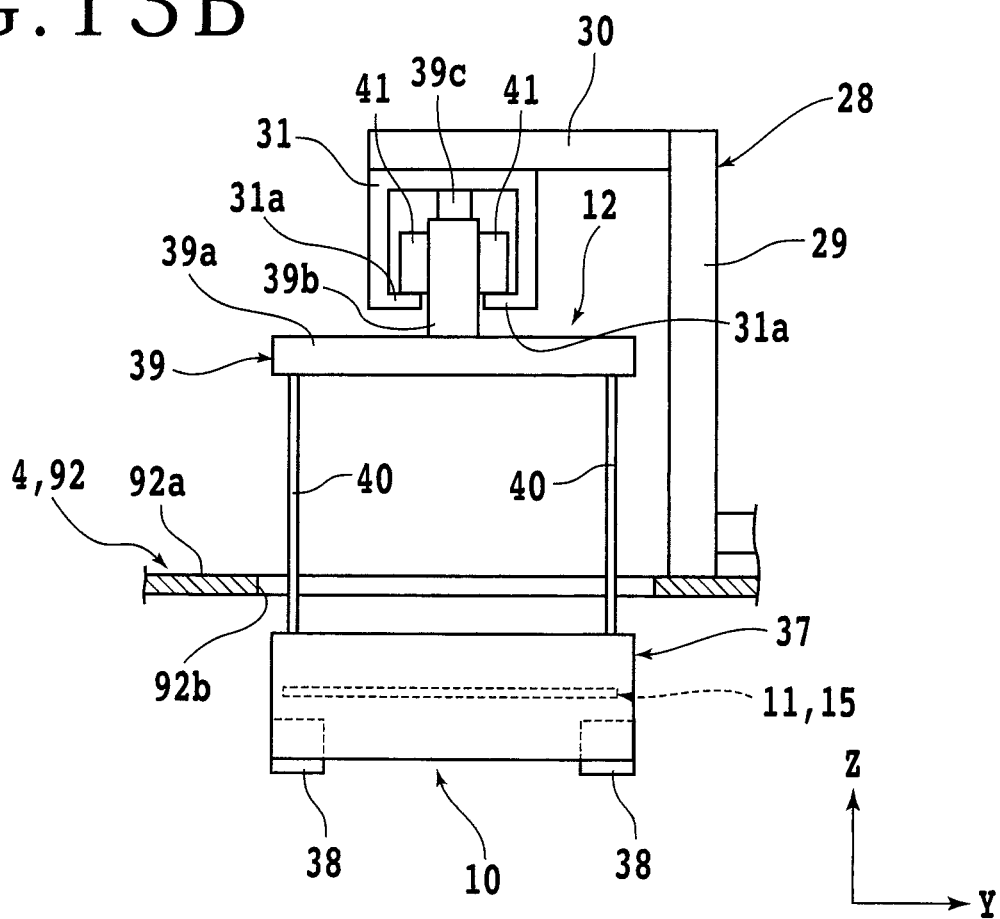
FIG. 13B is a side elevational view, partly in cross section, illustrating the state of FIG. 12B as viewed from the X-axis direction.

FIG. 13A is a side elevational view, partly in cross section, illustrating the state of FIG. 12A as viewed from an X-axis direction, and FIG. 13B is a side elevational view, partly in cross section, illustrating the state of FIG. 12B as viewed from the X-axis direction. For conveying the chassis 37 from the region of the conveyance passage 6 above the cutting apparatus 4 to the conveying vehicle holding base 50 of the cutting apparatus 4, the position of the automated workpiece conveying vehicle 10 is adjusted to position the wheels 41 at a starting point on an extension of the guide rail 31, as illustrated in FIGS. 12A and 13A.

Then, the wheels 38 are rotated to move the automated workpiece conveying vehicle 10 and the conveying unit 12 toward the guide rail 31. Specifically, the automated workpiece conveying vehicle 10 and the conveying unit 12 are moved in the X-axis direction. As a result, the protrusive block 39b of the conveying unit 12 is inserted into the gap between the pair of support members 31a of the guide rail 31, and the wheels 41 of the conveying unit 12 are placed onto the upper surfaces of the support members 31a.

At this timing, the electrode 39c of the conveying unit 12 contacts the guide rail 31, starting to supply electric power to the conveying unit 12, etc. After the wheels 41 of the conveying unit 12 have been placed on the upper surfaces of the pair of support members 31a, the wheels 41 are rotated to move the chassis 37 to a position directly above the opening 92b of the cutting apparatus 4.

Then, as illustrated in FIGS. 12B and 13B, the winch of the conveying unit 12 is actuated to draw the wires 40 from the base 39a. The chassis 37 is now lowered through the opening 92b and placed onto the conveying vehicle holding base 50. After the chassis 37 has been placed on the conveying vehicle holding base 50, the workpiece 11 (the frame 15) is unloaded from the chassis 37. After the workpiece 11 has been cut, the workpiece 11 (the frame 15) is loaded into the chassis 37.

For conveying the chassis 37 from the conveying vehicle holding base 50 of the cutting apparatus 4 to the region of the conveyance passage 6 above the cutting apparatus 4, the winch of the conveying unit 12 is actuated to wind up the wires 40 and store them in the base 39a. The chassis 37 is thus lifted through the opening 92b and unloaded out of the cover 92 of the cutting apparatus 4.

Next, the wheels 41 are rotated to move the automated workpiece conveying vehicle 10 and the conveying unit 12 toward the starting point described above. Specifically, the automated workpiece conveying vehicle 10 and the conveying unit 12 are moved in the X-axis direction. As a result, the wheels 41 of the conveying unit 12 are dislodged from the pair of the support members 31a.

At this timing, the electrode 39c of the conveying unit 12 leaves the guide rail 31, finishing supplying electric power to the conveying unit 12, etc. The wheels 38 of the automated workpiece conveying vehicle 10 are brought into contact with the conveyance passage 6, whereupon the automated workpiece conveying vehicle 10 can be self-propelled on the conveyance passage 6 by the wheels 38.

Figure 14:
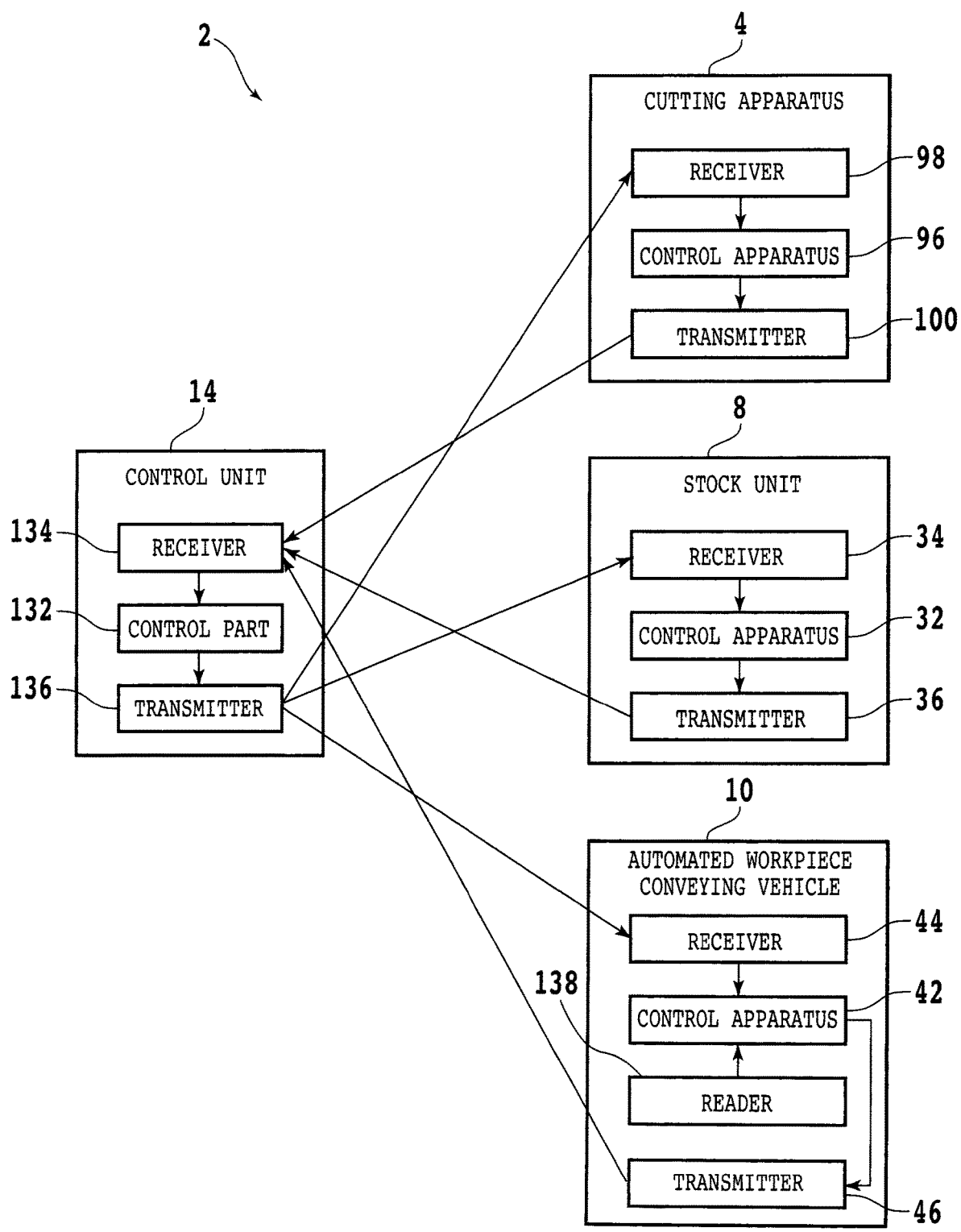
FIG. 14 is a functional block diagram for explaining an example of a control method of the conveyance system according to embodiment 1.

Next, an example of a control method of the conveyance system 2 according to the present embodiment will be described. FIG. 14 is a functional block diagram for explaining the example of the control method of the conveyance system 2. For example, when the situation in which the new workpiece 11 (unprocessed workpiece 11) is necessary occurs, the control apparatus 96 of the cutting apparatus 4 generates a notification signal (workpiece request signal) for notifying this. The notification signal (workpiece request signal) generated by the control apparatus 96 is transmitted from the transmitter 100 to the control unit 14.

As illustrated in FIG. 14, the control unit 14 includes a control part (control signal generating part) 132 that generates a control signal for executing various kinds of control. Typically, the control part 132 is formed of a computer including a processing apparatus such as a CPU and a storing apparatus such as a flash memory, and functions of the control part 132 are implemented by causing the processing apparatus and so forth to operate in accordance with software stored in the storing apparatus.

To this control part 132, a receiver 134 that receives notification signals transmitted from the cutting apparatus 4, the stock unit 8, the automated workpiece conveying vehicle 10, and so forth and a transmitter 136 that transmits control signals to the cutting apparatus 4, the stock unit 8, the automated workpiece conveying vehicle 10 (including the conveying unit 12), and so forth are connected.

When receiving the notification signal (workpiece request signal) transmitted from the transmitter 100 of the cutting apparatus 4, the receiver 134 of the control unit 14 sends it to the control part 132. When checking the notification signal (workpiece request signal) from the cutting apparatus 4, the control part 132 issues, to the automated workpiece conveying vehicle 10 (and the conveying unit 12), an instruction to move to a position near the stock unit 8 and convey the chassis 37 to the conveying vehicle holding base 26 of the stock unit 8. Specifically, the control part 132 generates a control signal (first conveyance instruction signal) equivalent to this instruction and transmits it from the transmitter 136 to the automated workpiece conveying vehicle 10.

When receiving the control signal (first conveyance instruction signal) from the control unit 14, the receiver 44 of the automated workpiece conveying vehicle 10 sends it to the control apparatus 42. The control apparatus 42 controls operation of the wheels (traveling mechanism) 38 and so forth based on this control signal (first conveyance instruction signal) and causes the automated workpiece conveying vehicle 10 to travel along the conveyance passage 6.

As illustrated in FIG. 14, a reader 138 for reading information of the information providing part 102b set on the conveyance passage 6 is connected to the control apparatus 42 of the automated workpiece conveying vehicle 10. Thus, the control apparatus 42 can check its position (a position of the automated workpiece conveying vehicle 10) by reading the information of the information providing part 102b by the reader 138.

When the control apparatus 42 confirms that the control apparatus 42 (the automated workpiece conveying vehicle 10) has moved to a position near the stock unit 8, the control apparatus 42 moves the automated workpiece conveying vehicle 10 and the conveying unit 12 in order to insert the protrusive block 39b of the conveying unit 12 into the gap between the pair of support members 31a of the guide rail 31 disposed above the stock unit 8. As a result, the wheels 41 of the conveying unit 12 are placed onto the upper surfaces of the pair of the support members 31a.

After the wheels 41 of the conveying unit 12 have been placed on the upper surfaces of the pair of support members 31a, the control apparatus 42 rotates the wheels 41 to move the chassis 37 to a position directly above the opening 16b of the stock unit 8. The control apparatus 42 lowers the chassis 37 through the opening 16b and places the chassis 37 onto the conveying vehicle holding base 26 in the stock unit 8.

After having placed the chassis 37 on the conveying vehicle holding base 26, the control apparatus 42 generates a notification signal (first conveyance completion signal) for notifying that the conveyance of the chassis 37 to the stock unit 8 is completed. The notification signal (first conveyance completion signal) generated by the control apparatus 42 is transmitted from the transmitter 46 to the control unit 14.

When the receiver 134 of the control unit 14 receives the notification signal (first conveyance completion signal) transmitted from the transmitter 46 of the automated workpiece conveying vehicle 10, the receiver 134 sends the received notification signal to the control part 132. When the control part 132 confirms the notification signal (first conveyance completion signal) from the automated workpiece conveying vehicle 10, the control part 132 issues an instruction to the stock unit 8 to load a new workpiece 11 into the chassis 37 on the conveying vehicle holding base 26. Specifically, the control part 132 generates a control signal (first loading instruction signal) representing the instruction, and transmits the control signal from the transmitter 136 to the stock unit 8.

When the receiver 34 of the stock unit 8 receives the control signal (first loading instruction signal) from the control unit 14, the receiver 34 sends the received control signal to the control apparatus 32. Based on the control signal (first loading instruction signal), the control apparatus 32 controls operation of the first raising-lowering mechanism, the push-pull arm 22, the pair of guide rails 24, the second raising-lowering mechanism, etc. to load a new workpiece 11 into the chassis 37.

When the new workpiece 11 is loaded into the chassis 37, the control apparatus 32 generates a notification signal (first loading completion signal) for notifying that the loading of the new workpiece 11 into the chassis 37 is completed. The notification signal (first loading completion signal) generated by the control apparatus 32 is transmitted from the transmitter 36 to the control unit 14.

When the receiver 134 of the control unit 14 receives the notification signal (first loading completion signal) transmitted from the transmitter 36 of the stock unit 8, the receiver 134 sends the received notification signal to the control part 132. When the control part 132 confirms the notification signal (first loading completion signal) from the stock unit 8, the control part 132 issues an instruction to the automated workpiece conveying vehicle 10 (and the conveying unit 12) to move to a position near the cutting apparatus 4 and convey the chassis 37 to the conveying vehicle holding base 50 of the cutting apparatus 4. Specifically, the control part 132 generates a control signal (second conveyance instruction signal) representing the instruction and transmits the control signal from the transmitter 136 to the automated workpiece conveying vehicle 10.

When the receiver 44 of the automated workpiece conveying vehicle 10 receives the control signal (second conveyance instruction signal) from the control unit 14, the receiver 44 sends the received control signal to the control apparatus 42. Based on the control signal (second conveyance instruction signal), the control apparatus 42 lifts the chassis 37 to convey the chassis 37 out of the stock unit 8. Thereafter, the control apparatus 42 controls operation of the wheels 41, etc. to move the chassis 37 to a position above the conveyance passage 6. Then, the control apparatus 42 controls operation of the wheels 38, etc. to propel the automated workpiece conveying vehicle 10 along the conveyance passage 6.

When the control apparatus 42 confirms that the control apparatus 42 (automated workpiece conveying vehicle 10) has moved to a position near the cutting apparatus 4, the control apparatus 42 moves the automated workpiece conveying vehicle 10 and the conveying unit 12 in order to insert the protrusive block 39b of the conveying unit 12 into the gap between the pair of support members 31a of the guide rail 31 disposed above the cutting apparatus 4. As a result, the wheels 41 of the conveying unit 12 are placed onto the upper surfaces of the pair of the support members 31a.

After the wheels 41 of the conveying unit 12 are placed on the upper surfaces of the pair of support members 31a, the control apparatus 42 rotates the wheels 41 to move the chassis 37 to a position directly above the opening 92b of the cutting apparatus 4. The control apparatus 42 lowers the chassis 37 through the opening 92b and places the chassis 37 onto the conveying vehicle holding base 50 in the cutting apparatus 4.

After having placed the chassis 37 on the conveying vehicle holding base 50, the control apparatus 42 generates a notification signal (second loading completion signal) for notifying that the conveyance of the chassis 37 to the cutting apparatus 4 is completed. The notification signal (second loading completion signal) generated by the control apparatus 42 is transmitted from the transmitter 46 to the control unit 14.

When the receiver 134 of the control unit 14 receives the notification signal (second loading completion signal) transmitted from the transmitter 46 of the automated workpiece conveying vehicle 10, the receiver 134 sends the received notification signal to the control part 132. When the control part 132 confirms the notification signal (second loading completion signal) from the automated workpiece conveying vehicle 10, the control part 132 issues an instruction to the cutting apparatus 4 to unload the new workpiece 11 out of the chassis 37 on the conveying vehicle holding base 50. Specifically, the control part 132 generates a control signal (first unloading instruction signal) representing the instruction and transmits the control signal from the transmitter 136 to the cutting apparatus 4.

When the receiver 98 of the cutting apparatus 4 receives the control signal (first unloading instruction signal) from the control unit 14, the receiver 98 sends the received control signal to the control apparatus 96. The control apparatus 96 controls operation of the constituent elements on the basis of the control signal (first unloading instruction signal) to unload the new workpiece 11 out of the chassis 37.

When the new workpiece 11 is unloaded from the chassis 37, the control apparatus 96, for example, generates a notification signal (first unloading completion signal) for notifying that the unloading of the workpiece 11 out of the chassis 37 is completed. The notification signal (first unloading completion signal) generated by the control apparatus 96 is transmitted from the transmitter 100 to the control unit 14.

According to the procedure described above, a workpiece 11 stored in the stock unit 8 can be conveyed to any cutting apparatus 4. The procedure for conveying the workpiece 11 from the stock unit 8 to a cutting apparatus 4 has mainly been described above. However, a procedure for conveying the workpiece 11 from the cutting apparatus 4 to the stock unit 8 is also similarly carried out.

Specifically, for example, when the processing of a workpiece 11 is completed, the control apparatus 96 of the cutting apparatus 4 generates a notification signal (processing completion signal) for notifying the completion of the processing. The notification signal (processing completion signal) generated by the control apparatus 96 is transmitted from the transmitter 100 to the control unit 14. When the receiver 134 of the control unit 14 receives the notification signal (processing completion signal) transmitted from the transmitter 100, the receiver 134 sends the received notification signal to the control part 132.

When the control part 132 confirms the notification signal (processing completion signal) from the cutting apparatus 4, the control part 132 issues an instruction to the automated workpiece conveying vehicle 10 (and the conveying unit 12) to move to a position near the cutting apparatus 4 and convey the chassis 37 to the conveying vehicle holding base 50 of the cutting apparatus 4. Specifically, the control part 132 generates a control signal (third conveyance instruction signal) representing the instruction and transmits the generated control signal from the transmitter 136 to the automated workpiece conveying vehicle 10.

When the receiver 44 of the automated workpiece conveying vehicle 10 receives the control signal (third conveyance instruction signal) from the control unit 14, the receiver 44 sends the received control signal to the control apparatus 42. Based on the control signal (third conveyance instruction signal), the control apparatus 42 controls operation of the wheels (traveling mechanisms) 38, etc. to propel the automated workpiece conveying vehicle 10 along the conveyance passage 6.

When the control apparatus 42 confirms that the control apparatus 42 (automated workpiece conveying vehicle 10) has moved to a position near the cutting apparatus 4, the control apparatus 42 moves the automated workpiece conveying vehicle 10 and the conveying unit 12 in order to insert the protrusive block 39b of the conveying unit 12 into the gap between the pair of support members 31a of the guide rail 31 disposed above the cutting apparatus 4. As a result, the wheels 41 of the conveying unit 12 are placed onto the upper surfaces of the pair of the support members 31a.

After the wheels 41 of the conveying unit 12 have been placed on the upper surfaces of the pair of support members 31a, the control apparatus 42 rotates the wheels 41 to move the chassis 37 to a position directly above the opening 92b of the cutting apparatus 4. The control apparatus 42 lowers the chassis 37 through the opening 92b and places the chassis 37 onto the conveying vehicle holding base 50 in the cutting apparatus 4.

After having placed the chassis 37 on the conveying vehicle holding base 50, the control apparatus 42 generates a notification signal (third conveyance completion signal) for notifying that the conveyance of the chassis 37 to the cutting apparatus 4 is completed. The notification signal (the third conveyance completion signal) generated by the control apparatus 42 is transmitted from the transmitter 46 to the control unit 14.

When the receiver 134 of the control unit 14 receives the notification signal (third conveyance completion signal) transmitted from the transmitter 46 of the automated workpiece conveying vehicle 10, the receiver 134 sends the received notification signal to the control part 132. When the control part 132 confirms the notification signal (third conveyance completion signal) from the automated workpiece conveying vehicle 10, the control part 132 issues an instruction to the cutting apparatus 4 to load the processed workpiece 11 into the chassis 37 on the conveying vehicle holding base 50. Specifically, the control part 132 generates a control signal (second loading instruction signal) representing the instruction and transmits the control signal from the transmitter 136 to the cutting apparatus 4.

When the receiver 98 of the cutting apparatus 4 receives the control signal (second loading instruction signal) from the control unit 14, the receiver 98 sends the received control signal to the control apparatus 96. Based on the control signal (second loading instruction signal), the control apparatus 96 controls operation of the constituent elements to load the processed workpiece 11 into the chassis 37.

When the processed workpiece 11 is loaded into the chassis 37, the control apparatus 96 generates a notification signal (second loading completion signal) for notifying that the loading of the workpiece 11 into the chassis 37 is completed. The notification signal (second loading completion signal) generated by the control apparatus 96 is transmitted from the transmitter 100 to the control unit 14.

When the receiver 134 of the control unit 14 receives the notification signal (second loading completion signal) transmitted from the transmitter 100 of the cutting apparatus 4, the receiver 134 sends the received notification signal to the control part 132. When the control part 132 confirms the notification signal (second loading completion signal) from the cutting apparatus 4, the control part 132 issues an instruction to the automated workpiece conveying vehicle 10 (and the conveying unit 12) to move to a position near the stock unit 8 and convey the chassis 37 to the conveying vehicle holding base 26 of the stock unit 8. Specifically, the control part 132 generates a control signal (fourth conveyance instruction signal) representing the instruction and transmits the control signal from the transmitter 136 to the automated workpiece conveying vehicle 10.

When the receiver 44 of the automated workpiece conveying vehicle 10 receives the control signal (fourth conveyance instruction signal) from the control unit 14, the receiver 44 sends the received control signal to the control apparatus 42. Based on the control signal (fourth conveyance instruction signal), the control apparatus 42 lifts the chassis 37 to convey the chassis 37 out of the cutting apparatus 4. Thereafter, the control apparatus 42 controls operation of the wheels 41, etc. to move the chassis 37 to a position above the conveyance passage 6. Then, the control apparatus 42 controls operation of the wheels 38, etc. to propel the automated workpiece conveying vehicle 10 along the conveyance passage 6.

When the control apparatus 42 confirms that the control apparatus 42 (automated workpiece conveying vehicle 10) has moved to a position near the stock unit 8, the control apparatus 42 moves the automated workpiece conveying vehicle 10 and the conveying unit 12 in order to insert the protrusive block 39b of the conveying unit 12 into the gap between the pair of support members 31a of the guide rail 31 disposed above the stock unit 8. As a result, the wheels 41 of the conveying unit 12 are placed onto the upper surfaces of the pair of the support members 31a.

After the wheels 41 of the conveying unit 12 have been placed on the upper surfaces of the pair of support members 31a, the control apparatus 42 rotates the wheels 41 to move the chassis 37 to a position directly above the opening 16b of the stock unit 8. The control apparatus 42 then lowers the chassis 37 through the opening 16b and places the chassis 37 onto the conveying vehicle holding base 26 in the stock unit 8.

After having placed the chassis 37 on the conveying vehicle holding base 26, the control apparatus 42 generates a notification signal (fourth conveyance completion signal) for notifying that the conveyance of the chassis 37 to the stock unit 8 is completed. The notification signal (fourth conveyance completion signal) generated by the control apparatus 42 is transmitted from the transmitter 46 to the control unit 14.

When the receiver 134 of the control unit 14 receives the notification signal (fourth conveyance completion signal) transmitted from the transmitter 46 of the automated workpiece conveying vehicle 10, the receiver 134 sends the received notification signal to the control part 132. When the control part 132 confirms the notification signal (fourth conveyance completion signal) from the automated workpiece conveying vehicle 10, the control part 132 issues an instruction to the stock unit 8 to unload the processed workpiece 11 out of the chassis 37 on the conveying vehicle holding base 26. Specifically, the control part 132 generates a control signal (second unloading instruction signal) representing the instruction and transmits the control signal from the transmitter 136 to the stock unit 8.

When the receiver 34 of the stock unit 8 receives the control signal (second unloading instruction signal) from the control unit 14, the receiver 34 sends the received control signal to the control apparatus 32. Based on the control signal (second unloading instruction signal), the control apparatus 32 controls operation of the first raising-lowering mechanism, the push-pull arm 22, the pair of guide rails 24, the second raising-lowering mechanism, etc. to unload the processed workpiece 11 out of the chassis 37.

When the processed workpiece 11 is unloaded from the chassis 37, the control apparatus 32, for example, generates a notification signal (second unloading completion signal) for notifying that the unloading of the workpiece 11 out of the chassis 37 is completed. The notification signal (second unloading completion signal) generated by the control apparatus 32 is transmitted from the transmitter 36 to the control unit 14. According to the procedure described above, the workpiece 11 processed by the cutting apparatus 4 can be conveyed to the stock unit 8.

The procedure described above can be changed arbitrarily within a range in which the workpiece 11 can be conveyed appropriately. For example, a plurality of steps included in the above procedure may be carried out simultaneously, or the order of steps may be switched around within a range in which the steps thus switched around pose no difficulty in conveying the workpiece 11. Similarly, arbitrary steps may be added, changed, or omitted within a range in which the steps thus added, changed, or omitted pose no difficulty in conveying the workpiece 11.

As described above, the conveyance system 2 according to the present embodiment includes a conveyance passage 6 disposed across a plurality of cutting apparatuses (processing apparatuses) 4, an automated workpiece conveying vehicle (automated conveying vehicle) 10 for traveling on the conveyance passage 6, the automated workpiece conveying vehicle 10 including a chassis (workpiece storage member) 37 for storing a workpiece 11, wheels (traveling mechanisms) 38 mounted on the chassis 37, and a receiver 44 for receiving control signals, a stock unit 8 including a conveying vehicle holding base (storage member holding base) 26 for holding the chassis 37 in transferring the workpiece 11 from a cassette (workpiece stocker) 20 storing workpieces therein to the chassis 37 of the automated workpiece conveying vehicle 10, and a receiver 34 for receiving control signals, and a conveying unit (storage member conveying unit) 12 for conveying the chassis 37 between a region of the conveyance passage 6 above the stock unit 8 and the conveying vehicle holding base 26 of the stock unit 8 or between a region of the conveyance passage 6 above the cutting apparatus 4 and the inside of the cutting apparatus 4.

Therefore, by conveying the chassis 37 of the automated workpiece conveying vehicle 10 that has received the workpiece 11 from the cassette 20 in the stock unit 8 to the conveyance passage 6 with the conveying unit 12 and propelling the automated workpiece conveying vehicle 10 on the conveyance passage 6, it is possible to convey workpieces 11 respectively to a plurality of cutting apparatuses 4. The chassis 37 of the automated workpiece conveying vehicle 10 is conveyed into the cutting apparatus 4 by the conveying unit 12 after the automated workpiece conveying vehicle 10 has been propelled to travel, for example.

In the conveyance system 2 according to the present embodiment, the conveyance passage 6 is disposed in a space directly above the cutting apparatus 4. Consequently, it is not necessary to take into account the structure of side surfaces of each cutting apparatus 4 in designing the conveyance passage 6. In other words, the conveyance system can be constructed with ease.

Figure 15A:
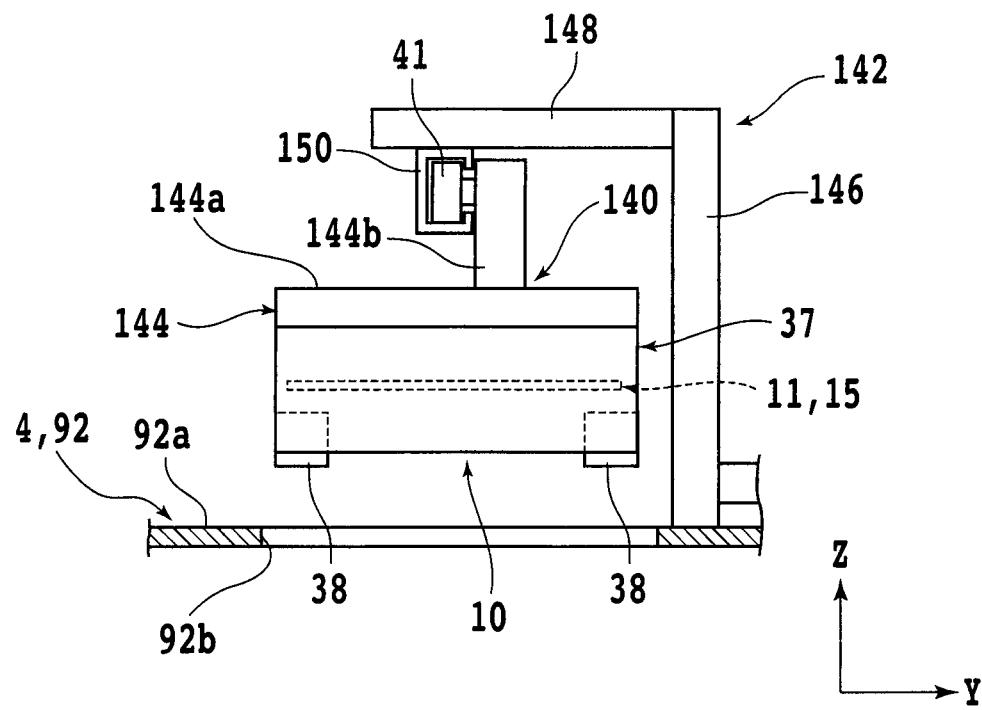
FIG. 15A is a side elevational view, partly in cross section, illustrating how a conveying unit according to a modification is to be supported on a guide rail, as viewed from an X-axis direction.
Figure 15B:
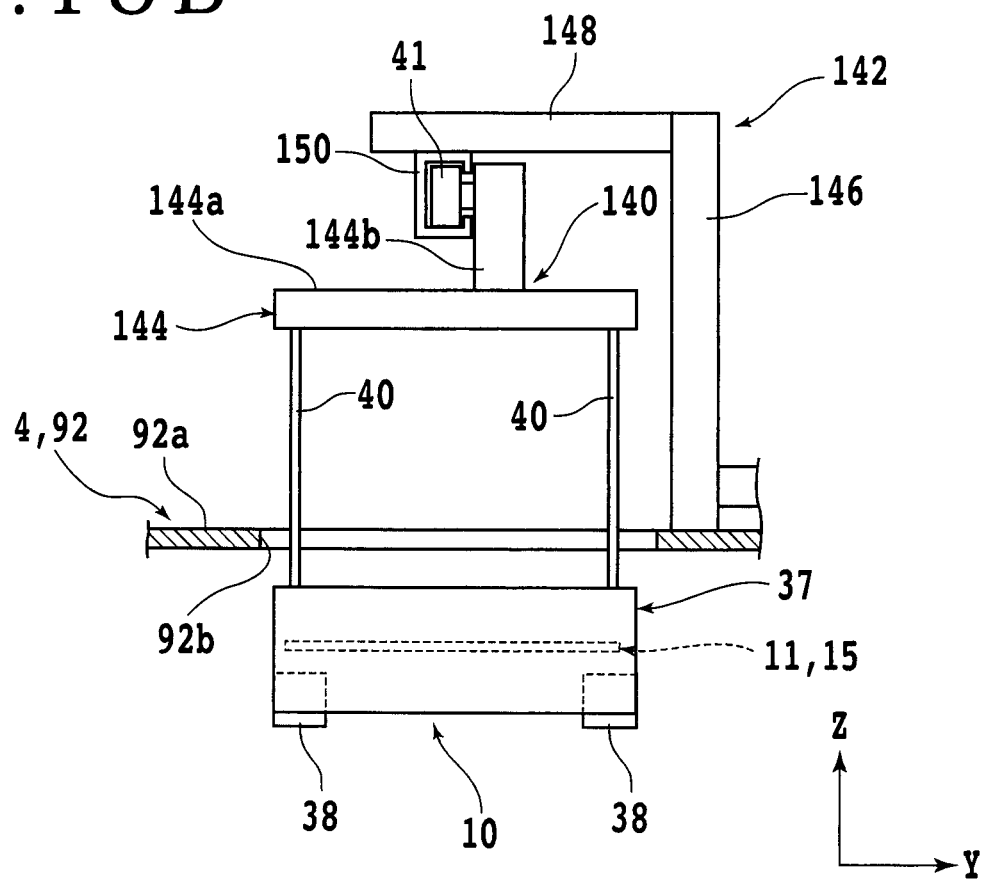
FIG. 15B is a side elevational view, partly in cross section, illustrating how the conveying unit according to the modification lowers a chassis, as viewed from the X-axis direction.

According to the embodiment described above, the conveying unit (storage member conveying unit) 12 compatible with the pair of support members 31a with a predetermined gap therebetween is illustrated. The conveying unit and the conveying unit support structure according to the present invention are not limited to particular details. FIG. 15A is a side elevational view, partly in cross section, illustrating a conveying unit 140 and a conveying unit support structure 142 according to a modification, as viewed from an X-axis direction, and FIG. 15B is a side elevational view, partly in cross section, illustrating how the conveying unit 140 according to the modification lowers a chassis 37, as viewed from the X-axis direction.

The conveying unit 140 according to the modification has basic structural details identical to those of the conveying unit 12 according to the embodiment described above. Therefore, only main differences will be described below. As illustrated in FIGS. 15A and 15B, the conveying unit 140 according to the modification includes an upper casing 144.

The upper casing 144 includes a base 144a shaped as a flat plate having a size that is about the same as the size of the chassis 37 as viewed in plan. A plurality of wires 40 are disposed on a lower surface of the base 144a in respective areas corresponding to the four corners of the base 144a. The base 144a houses therein a winch (not illustrated) for winding up and down the wires 40.

A protrusive block 144b shaped as a rectangular parallelepiped is disposed on an upper surface of the base 144a. A plurality of wheels (traveling mechanisms) 41 are mounted on a side surface of the protrusive block 144b. Each of the wheels 41 is coupled to a rotational drive source such as an electric motor or the like so as to be rotated thereby. In the conveying unit 140 according to the present modification, the wheels (traveling mechanisms) 41 are mounted on only one side of the protrusive block 144b in the Y-axis direction.

The conveying unit support structure 142 is disposed above the cover 92 of the cutting apparatus 4. The conveying unit support structure 142 includes, for example, a support structure 146 having a lower end fixed to the conveyance passage 6 (or the cutting apparatus 4), and a support plate 148 shaped as a flat plate extending along the X-axis and Y-axis directions and having an end fixed to an upper end of the support structure 146. A hollow guide rail 150 extending along the X-axis direction is disposed on a lower surface of the support plate 148 at the other end side thereof. The structural details and layout of the conveying unit support structure 142 may be changed arbitrarily depending on the structural details of the cutting apparatus 4 and the layout of the conveyance passage 6.

The guide rail 150 has a predetermined opening defined in a side wall thereof through which the wheels 41 can be inserted into the guide rail 150. When the automated workpiece conveying vehicle 10 and the conveying unit 140 are moved in the X-axis direction to insert the wheels 41 into the guide rail 150, for example, the conveying unit 140 is supported by the conveying unit support structure 142. Therefore, in a case where the conveying unit 140 and the conveying unit support structure 142 according to the present modification are used, the automated workpiece conveying vehicle 10 and the conveying unit 140 can be moved along the guide rail 150.

(Embodiment 2)

In the present embodiment, a conveyance system that treats the cutting blade 82 and so forth as the target of conveyance in addition to the workpiece 11 will be described. The basic configuration of the conveyance system according to the present embodiment is the same as the basic configuration of the conveyance system 2 according to embodiment 1. Thus, a constituent element common to the conveyance system 2 of embodiment 1 is given the same numeral, and the detailed description is omitted.

Figure 16:
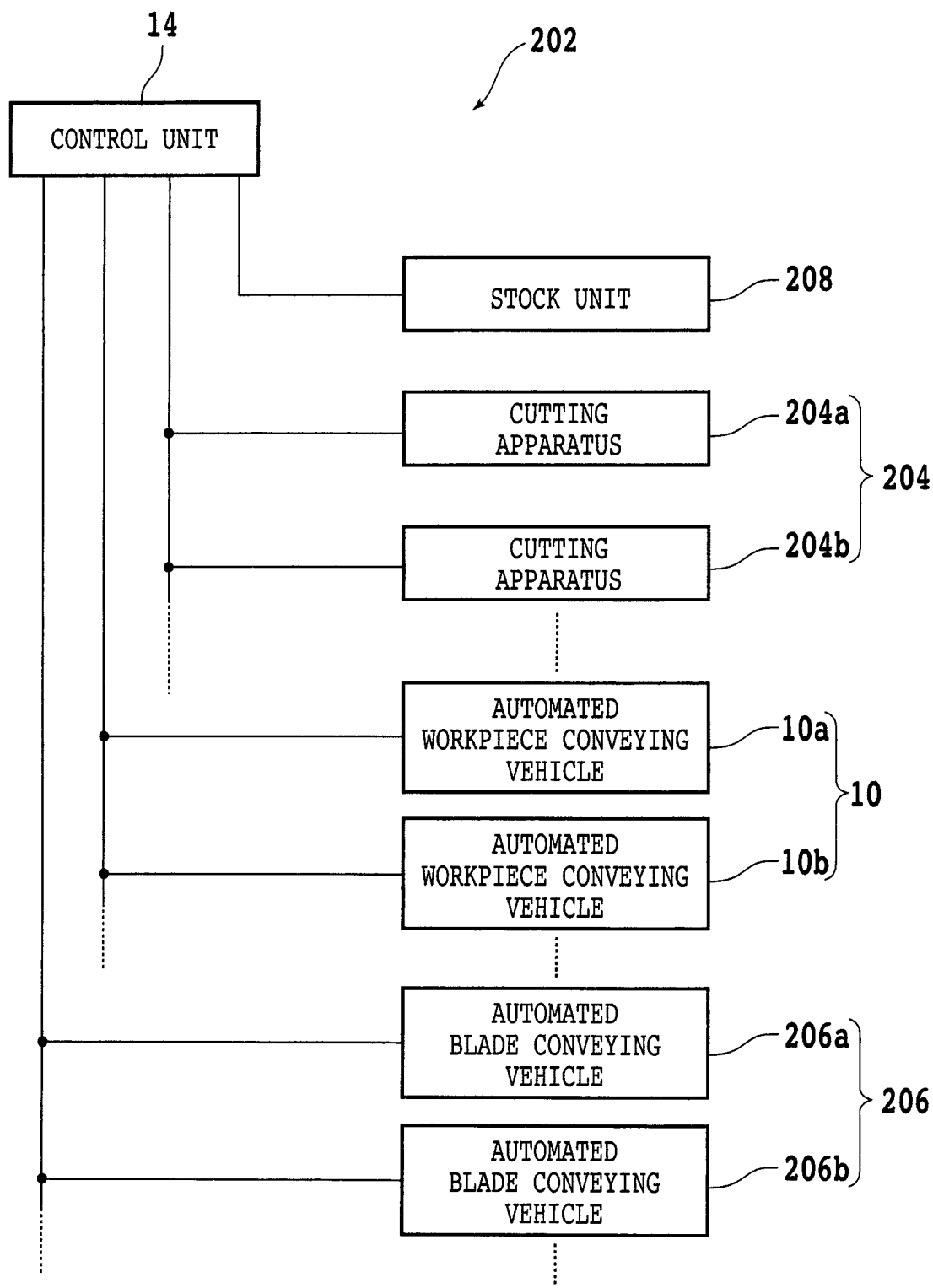
FIG. 16 is a functional block diagram illustrating an example of the connection relationship of a conveyance system according to embodiment 2.

FIG. 16 is a functional block diagram illustrating an example of the connection relationship of a conveyance system 202 according to the present embodiment. As illustrated in FIG. 16, the automated workpiece conveying vehicles (automated conveying vehicles) 10, cutting apparatuses 204, automated blade conveying vehicles 206, and a stock unit 208 are wirelessly connected to the control unit 14 of the conveyance system 202 according to the present embodiment.

The automated blade conveying vehicle 206 travels on the conveyance passage 6 (see FIG. 16 and so forth) similarly to the automated workpiece conveying vehicle 10 and conveys the cutting blade 82 to each cutting apparatus 204. The stock unit 208 is configured to be capable of housing the cutting blades 82 supplied to the respective cutting apparatuses 204 in addition to plural workpieces 11.

In FIG. 16, two automated workpiece conveying vehicles 10a and 10b, two cutting apparatus 204a and 204b, and two automated blade conveying vehicles 206a and 206b are illustrated for convenience of description. However, there is no limit to the number of pieces regarding each of them. Furthermore, the control unit 14 may be connected to the automated workpiece conveying vehicles 10, the cutting apparatuses 204, the automated blade conveying vehicles 206, the stock unit 208, and so forth in a wired manner.

Figure 17:
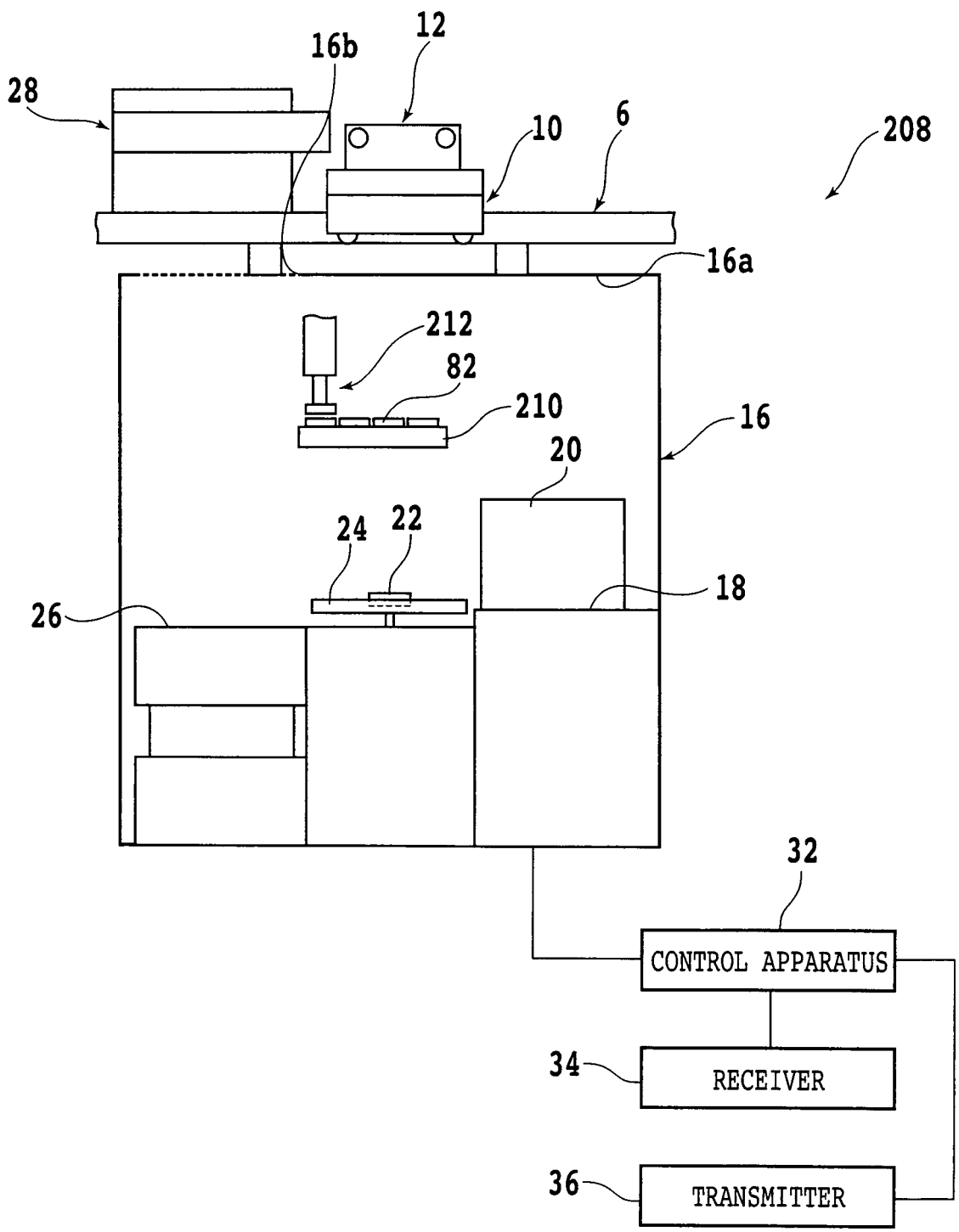
FIG. 17 is a side view illustrating a configuration example of a stock unit according to embodiment 2.

FIG. 17 is a side view illustrating a configuration example of the stock unit 208 according to embodiment 2. As illustrated in FIG. 17, the basic configuration of the stock unit 208 is the same as the basic configuration of the stock unit 8 according to embodiment 1. However, a blade stocker 210 for housing plural cutting blades 82 is disposed in the stock unit 208 according to the present embodiment.

The blade stocker 210 is formed into a tray shape whose upper surface side is segmented into plural regions, for example. The cutting blade 82 is housed in each region. Furthermore, near this blade stocker 210, a blade conveying arm (blade conveying part) 212 that conveys the cutting blade 82 between the blade stocker 210 and the automated blade conveying vehicle 206 is disposed.

Figure 18:
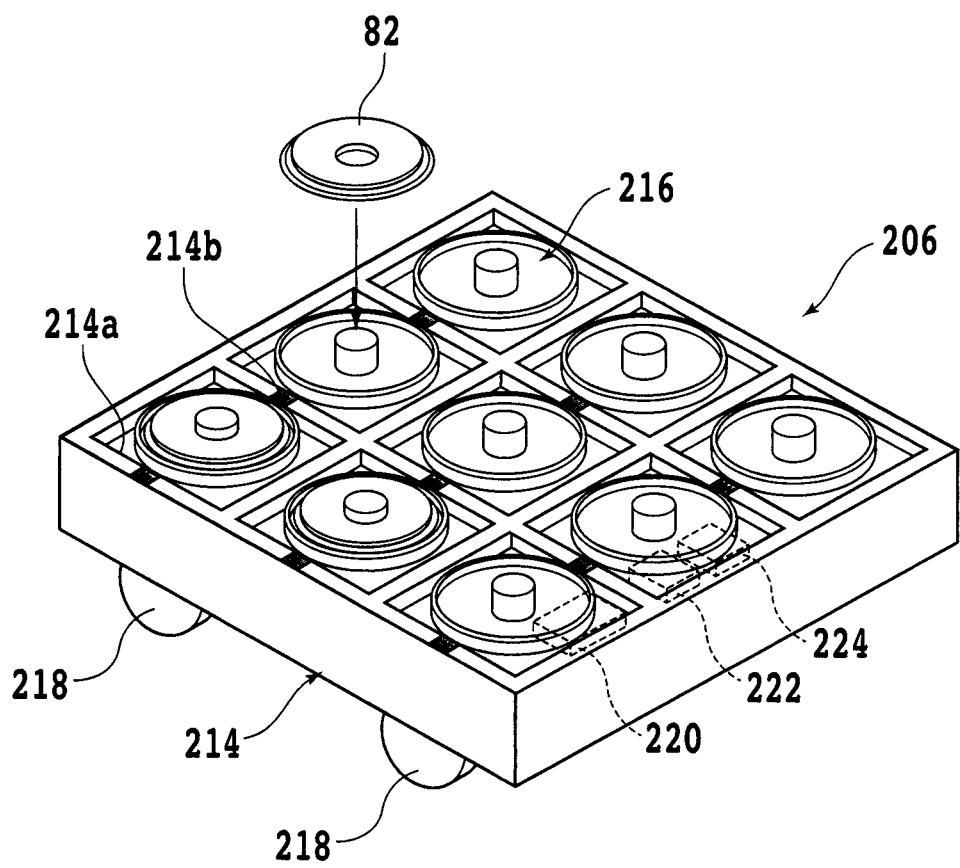
FIG. 18 is a perspective view illustrating a configuration example of an automated blade conveying vehicle.

FIG. 18 is a perspective view illustrating a configuration example of the automated blade conveying vehicle 206. As illustrated in FIG. 18, the automated blade conveying vehicle 206 includes a chassis (blade holding part) 214 with a tray shape. Plural recesses 214a corresponding to the size of the cutting blade 82 are formed on the upper surface side of the chassis 214 and a blade case 216 that can house the cutting blade 82 is disposed in each recess 214a.

The cutting blade 82 conveyed by the blade conveying arm 212 is placed on the blade case 216 disposed in the recess 214a of this chassis 214. An information providing part 214b such as a wireless tag or identification code is set at a position corresponding to each blade case 216 (recess 214a) of the chassis 214. Thus, on the basis of information provided by the information providing part 214b, the cutting blade 82 housed in each blade case 216 can be easily identified.

Plural (in the present embodiment, four) wheels (traveling mechanism) 218 are attached to the lower surface side of the chassis 214. Each wheel 218 is coupled to a rotational drive source such as a motor and rotates. By rotating these wheels 218 by the rotational drive source, the automated blade conveying vehicle 206 travels on the conveyance passage 6. As the wheels 218, what is called Mecanum wheels in which plural inclined barrel-shaped (cylinder-shaped) rotating bodies are attached to the outer circumferential surface in contact with the conveyance passage 6, or the like, can be used.

A control apparatus 220 that controls operation of the automated blade conveying vehicle 206 is disposed on the inside of the chassis 214. Typically, the control apparatus 220 is formed of a computer including a processing apparatus such as a CPU and a storing apparatus such as a flash memory, and functions of the control apparatus 220 are implemented by causing the processing apparatus and so forth to operate in accordance with software stored in the storing apparatus.

To this control apparatus 220, a receiver 222 that receives a signal for control (control signal) transmitted from the control unit 14 and a transmitter 224 that transmits a signal for notification (notification signal) to the control unit 14 are connected. The control apparatus 220 controls the operation (traveling) of the automated blade conveying vehicle 206 based on the signal received by the receiver 222. Furthermore, the control apparatus 220 transmits a necessary signal to the control unit 14 through the transmitter 224.

Figure 19:
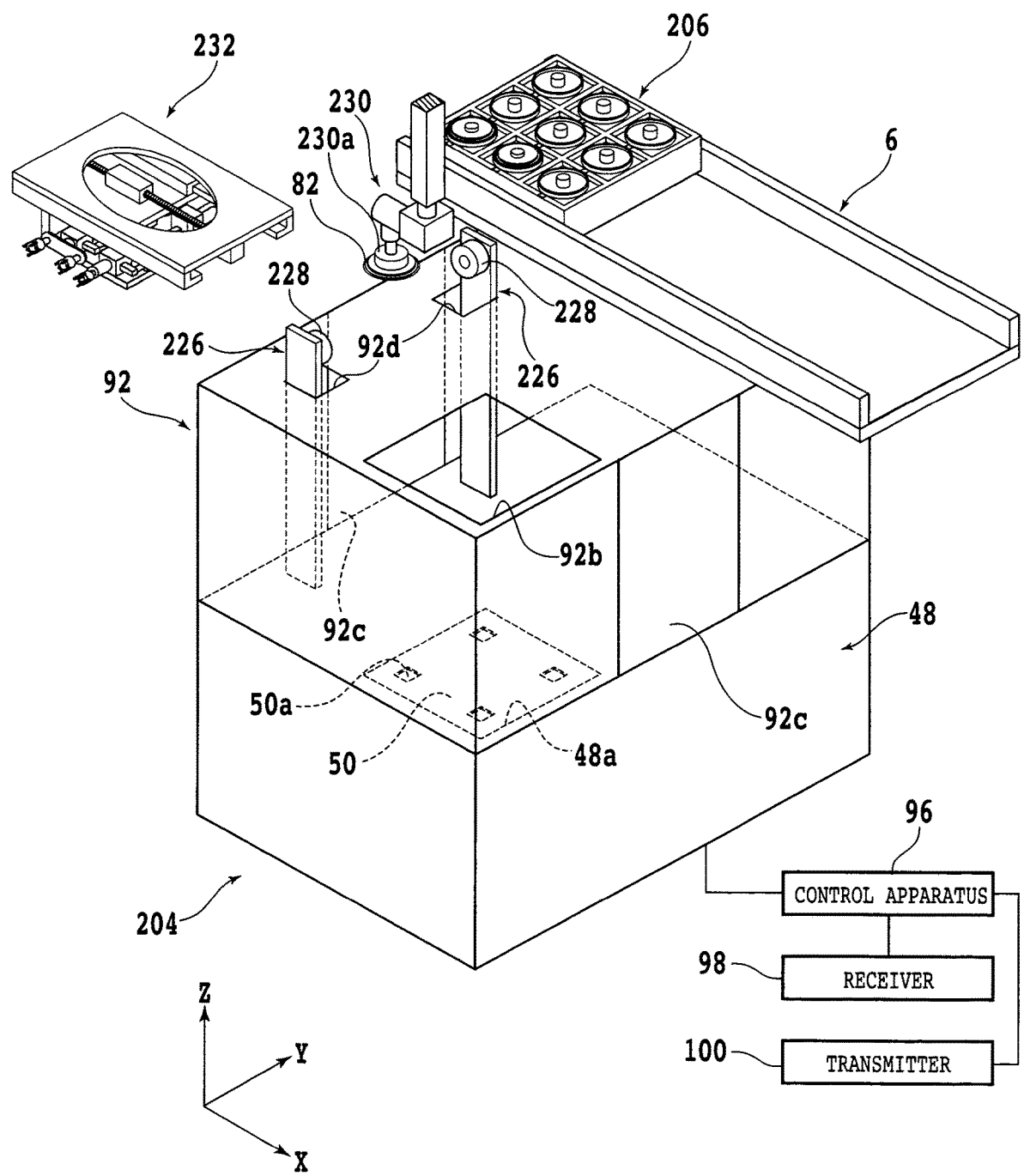
FIG. 19 is a perspective view illustrating the appearance of a cutting apparatus and so forth according to embodiment 2.

FIG. 19 is a perspective view illustrating the appearance of the cutting apparatus 204 and so forth. As illustrated in FIG. 19, the basic configuration of the cutting apparatus 204 is the same as the basic configuration of the cutting apparatus 4 according to embodiment 1. The structural details of peripheral parts around the cutting apparatus 204 are identical to the structural details of peripheral parts around the cutting apparatus 4 according to Embodiment 1. For example, the conveying unit support structure 28, etc. is disposed above the cutting apparatus 204, though omitted from illustration in FIG. 19.

In this cutting apparatus 204, two openings 92d that vertically penetrate the ceiling 92a of the cover 92 are further made. Each opening 92d is formed with a size that allows the cutting blade 82 to pass through the opening 92d. Furthermore, a blade raising-lowering mechanism 226 for raising and lowering the cutting blade 82 is disposed in each opening 92d.

The blade raising-lowering mechanism 226 includes a blade holding part 228 that holds the cutting blade 82 and raises and lowers this blade holding part 228. Thus, when this blade holding part 228 is raised and lowered after the blade holding part 228 is caused to hold the cutting blade 82, the cutting blade 82 can be conveyed from the outside of the cover 92 to the inside or be conveyed from the inside of the cover 92 to the outside.

Over the ceiling 92a of the cover 92, a blade conveying arm 230 that conveys the cutting blade 82 between the blade holding part 228 included in the blade raising-lowering mechanism 226 and the automated blade conveying vehicle 206 that waits near the blade raising-lowering mechanism 226 is disposed. The blade conveying arm 230 includes a blade grasping part 230a that holds the cutting blade 82 and conveys the cutting blade 82 between the automated blade conveying vehicle 206 and the blade holding part 228 by rotating, raising and lowering this blade grasping part 230a.

A blade changer 232 that replaces the cutting blade 82 of the cutting unit 80 by automatic control is further disposed inside the cover 92 of the cutting apparatus 204. The blade changer 232 is connected to the control apparatus 96 together with the blade raising-lowering mechanism 226 and the blade conveying arm 230.

Figure 20:
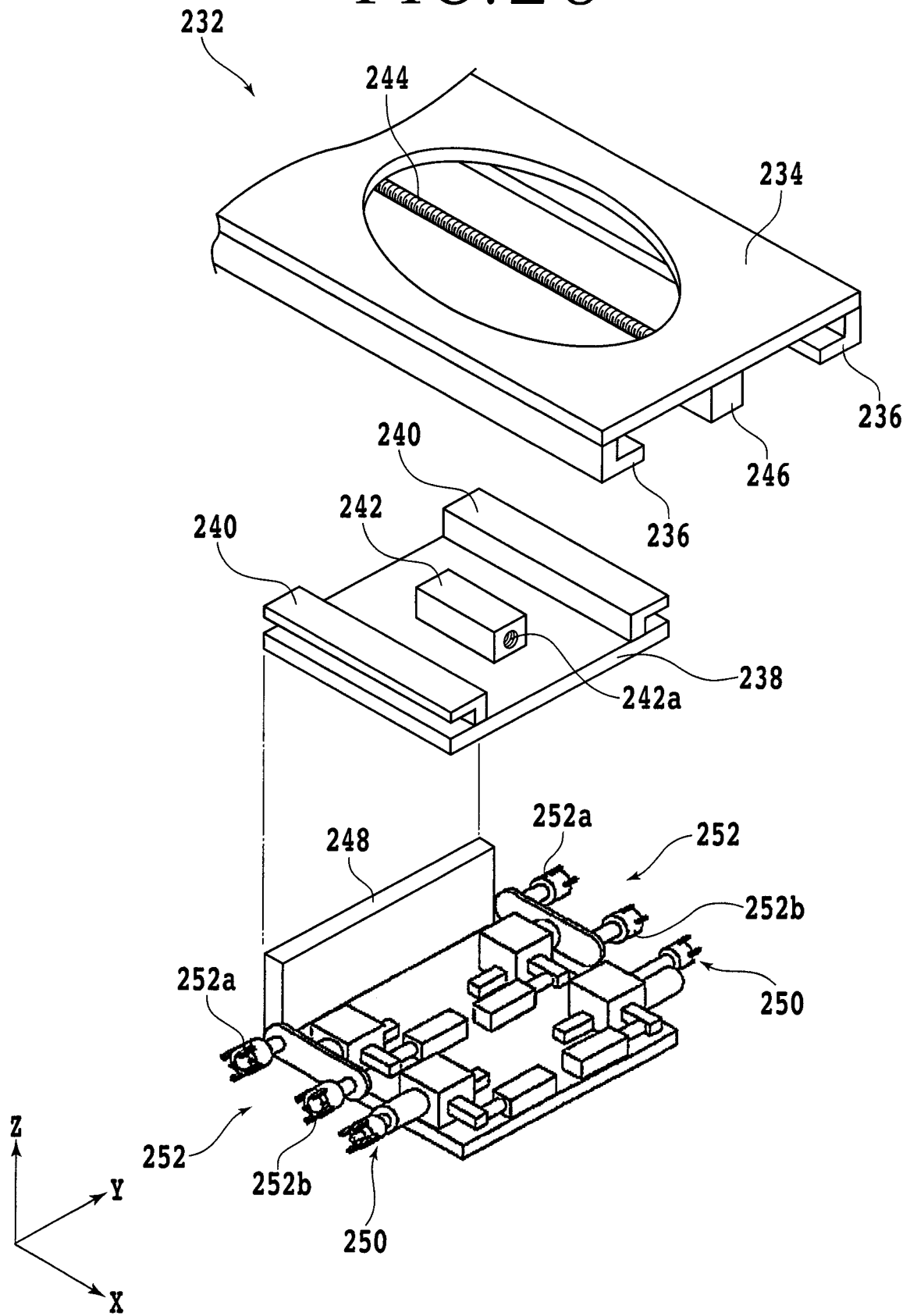
FIG. 20 is an exploded perspective view illustrating a configuration example of a blade changer.

FIG. 20 is an exploded perspective view illustrating a configuration example of the blade changer 232. This blade changer 232 includes a fixed plate 234 whose position is fixed relative to the pedestal 48, the cover 92, and so forth, for example. A pair of guide rails 236 that are long in the X-axis direction are disposed on the lower surface side of the fixed plate 234. A moving plate 238 is supported by the guide rails 236 in a slidable manner along the X-axis direction.

Brackets 240 corresponding to the shapes of the guide rails 236 are disposed at end parts of the moving plate 238 in the Y-axis direction and the moving plate 238 is supported by the guide rails 236 with the intermediary of these brackets 240. A nut part 242 is fixed to the upper surface of the moving plate 238. A ball screw 244 substantially parallel to the X-axis direction is inserted into a screw hole 242a of the nut part 242 in a rotatable manner.

A pulse motor 246 is coupled to one end of the ball screw 244. When the ball screw 244 is rotated by this pulse motor 246, the moving plate 238 moves in the X-axis direction along the guide rails 236. A changer support structure 248 is fixed to the lower surface side of the moving plate 238.

A pair of nut attaching-detaching mechanisms 250 for attaching and detaching a fixing nut (not illustrated) that fixes the cutting blade 82 to the cutting unit 80 are supported by the changer support structure 248. Each nut attaching-detaching mechanism 250 is configured to be capable of moving along the Y-axis direction and rotating around a rotation axis parallel to the Y-axis direction. By grasping and rotating the fixing nut by this nut attaching-detaching mechanism 250, the fixing nut can be attached to the cutting unit 80 or the fixing nut can be detached from the cutting unit 80.

Furthermore, a pair of blade replacement mechanisms 252 for replacing the cutting blade 82 are supported by the changer support structure 248. Each blade replacement mechanism 252 includes a first blade holding part 252a and a second blade holding part 252b that can each hold the cutting blade 82. This blade replacement mechanism 252 is configured to be capable of moving along the Y-axis direction and exchanging the positions of the first blade holding part 252a and the second blade holding part 252b in the X-axis direction.

When the cutting blade 82 is replaced by the blade changer 232, for example, the cutting blade 82 for replacement held by the blade holding part 228 of the blade raising-lowering mechanism 226 is received by the first blade holding part 252a. Then, the fixing nut is detached from the cutting unit 80 by the nut attaching-detaching mechanism 250. Furthermore, the cutting blade 82 mounted to the cutting unit 80 is detached from the cutting unit 80 by the second blade holding part 252b.

Thereafter, the positions of the first blade holding part 252a and the second blade holding part 252b are exchanged and the cutting blade 82 for replacement is attached to the cutting unit 80 by the first blade holding part 252a. Then, finally the fixing nut is attached to the cutting unit 80 by the nut attaching-detaching mechanism 250. The cutting blade 82 previously mounted to the cutting unit 80 is transferred from the second blade holding part 252b to the blade holding part 228 of the blade raising-lowering mechanism 226, for example.

Figure 21:
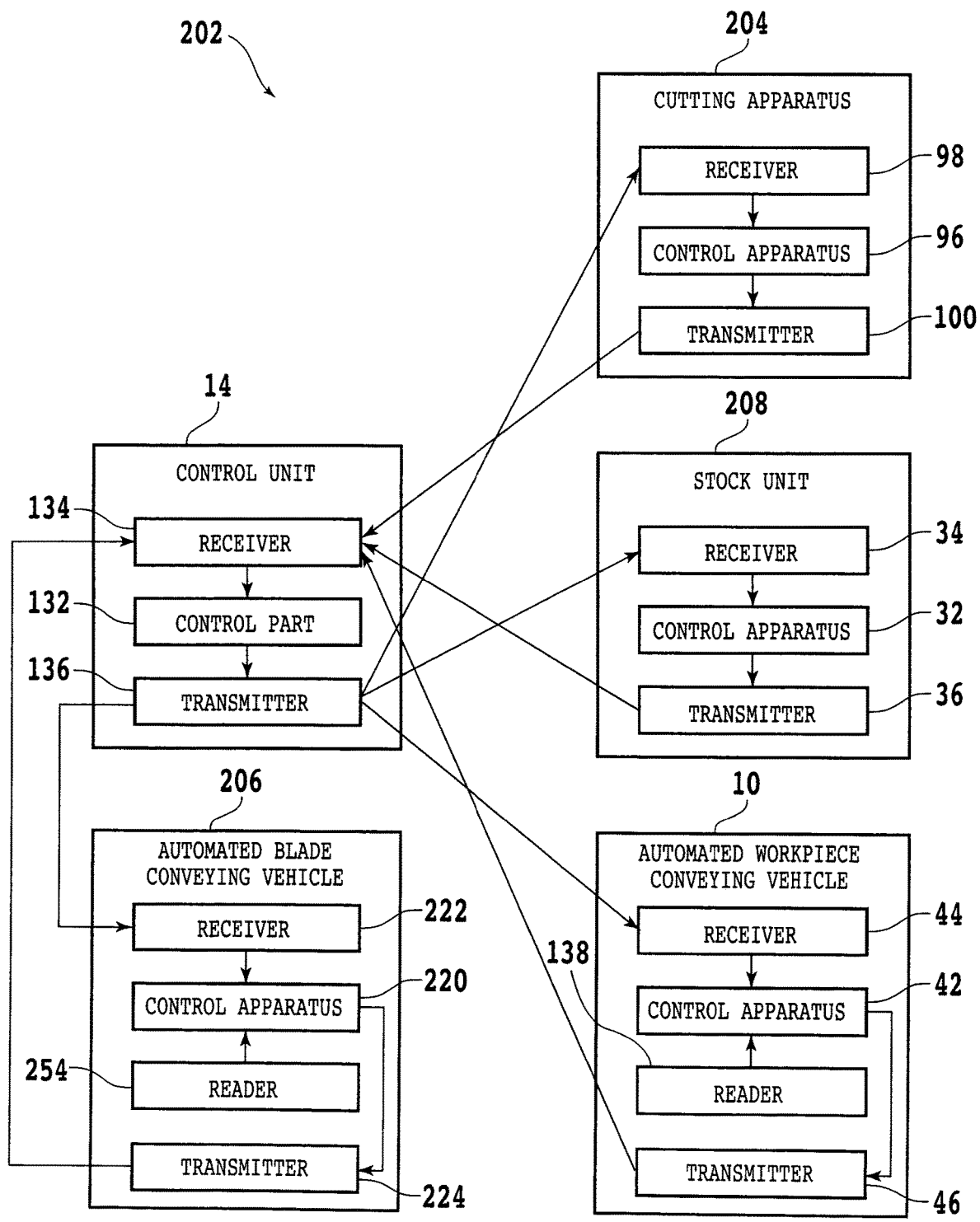
FIG. 21 is a functional block diagram for explaining an example of the control method of the conveyance system according to embodiment 2.

Next, an example of the control method of the conveyance system 202 according to the present embodiment will be described. FIG. 21 is a functional block diagram for explaining the example of the control method of the conveyance system 202. The control relating to conveyance of the workpiece 11 is the same as embodiment 1. Therefore, an example of the control relating to conveyance of the cutting blade 82 will be mainly described in the present embodiment.

For example, when the situation in which replacement of the cutting blade 82 is necessary occurs, the control apparatus 96 of the cutting apparatus 204 generates a notification signal (blade request signal) for notifying this. The notification signal (blade request signal) generated by the control apparatus 96 is transmitted from the transmitter 100 to the control unit 14.

When receiving the notification signal (blade request signal) transmitted from the transmitter 100 of the cutting apparatus 204, the receiver 134 of the control unit 14 sends it to the control part 132. When checking the notification signal (blade request signal) from the cutting apparatus 204, the control part 132 issues, to the automated blade conveying vehicle 206, an instruction to wait at a position near the stock unit 208 (a position at which the cutting blade 82 can be transferred). Specifically, the control part 132 generates a control signal (first wait instruction signal) equivalent to this instruction and transmits it from the transmitter 136 to the automated blade conveying vehicle 206.

When receiving the control signal (first wait instruction signal) from the control unit 14, the receiver 222 of the automated blade conveying vehicle 206 sends it to the control apparatus 220. The control apparatus 220 controls operation of the wheels (traveling mechanism) 218 and so forth based on this control signal (first wait instruction signal) and causes the automated blade conveying vehicle 206 to travel along the conveyance passage 6.

As illustrated in FIG. 21, a reader 254 for reading information of the information providing part 102b set on the conveyance passage 6 is connected to the control apparatus 220 of the automated blade conveying vehicle 206. Thus, the control apparatus 220 can check a position of the control apparatus 220 (a position of the automated blade conveying vehicle 206) by reading the information of the information providing part 102b by the reader 254.

When confirming that the control apparatus 220 (the automated blade conveying vehicle 206) has moved to near the stock unit 208, the control apparatus 220 stops the wheels 218 and so forth. Furthermore, the control apparatus 220 generates a notification signal (first standby signal) for notifying that the automated blade conveying vehicle 206 is waiting at a position near the stock unit 208. The notification signal (first standby signal) generated by the control apparatus 220 is transmitted from the transmitter 224 to the control unit 14.

When receiving the notification signal (first standby signal) transmitted from the transmitter 224 of the automated blade conveying vehicle 206, the receiver 134 of the control unit 14 sends it to the control part 132. When checking the notification signal (first standby signal) from the automated blade conveying vehicle 206, the control part 132 issues, to the stock unit 208, an instruction to convey the cutting blade 82 to the automated blade conveying vehicle 206. Specifically, the control part 132 generates a control signal (first conveyance instruction signal) equivalent to this instruction and transmits it from the transmitter 136 to the stock unit 208.

When receiving the control signal (first conveyance instruction signal) from the control unit 14, the receiver 34 of the stock unit 208 sends it to the control apparatus 32. The control apparatus 32 controls operation of the blade conveying arm 212 and so forth based on this control signal (first conveyance instruction signal) to carry out the cutting blade 82 from the blade stocker 210 and place the cutting blade 82 on the chassis 214 of the automated blade conveying vehicle 206. Specifically, the cutting blade 82 is placed on the blade case 216 indicated from the control unit 14 through the control signal (first conveyance instruction signal), for example.

When the cutting blade 82 is conveyed to the automated blade conveying vehicle 206, the control apparatus 32 generates a notification signal (first conveyance completion signal) for notifying that the conveyance of the cutting blade 82 to the automated blade conveying vehicle 206 has been completed. The notification signal (first conveyance completion signal) generated by the control apparatus 32 is transmitted from the transmitter 36 to the control unit 14.

When receiving the notification signal (first conveyance completion signal) transmitted from the transmitter 36 of the stock unit 208, the receiver 134 of the control unit 14 sends it to the control part 132. When checking the notification signal (first conveyance completion signal) from the stock unit 208, the control part 132 issues, to the automated blade conveying vehicle 206, an instruction to move to a position near the cutting apparatus 204 (at which the cutting blade 82 can be transferred) and wait. Specifically, the control part 132 generates a control signal (second wait instruction signal) equivalent to this instruction and transmits it from the transmitter 136 to the automated blade conveying vehicle 206.

When receiving the control signal (second wait instruction signal) from the control unit 14, the receiver 222 of the automated blade conveying vehicle 206 sends it to the control apparatus 220. The control apparatus 220 controls operation of the wheels 218 and so forth based on this control signal (second wait instruction signal) and causes the automated blade conveying vehicle 206 to travel along the conveyance passage 6.

When confirming that the automated blade conveying vehicle 206 has moved to near the cutting apparatus 204, the control apparatus 220 stops the wheels 218 and so forth. Furthermore, the control apparatus 220 generates a notification signal (second standby signal) for notifying that the automated blade conveying vehicle 206 is waiting at a position near the cutting apparatus 204. The notification signal (second standby signal) generated by the control apparatus 220 is transmitted from the transmitter 224 to the control unit 14.

When receiving the notification signal (second standby signal) transmitted from the transmitter 224 of the automated blade conveying vehicle 206, the receiver 134 of the control unit 14 sends it to the control part 132. When checking the notification signal (second standby signal) from the automated blade conveying vehicle 206, the control part 132 issues, to the cutting apparatus 204, an instruction to convey the cutting blade 82 from the automated blade conveying vehicle 206. Specifically, the control part 132 generates a control signal (second conveyance instruction signal) equivalent to this instruction and transmits it from the transmitter 136 to the cutting apparatus 204.

When receiving the control signal (second conveyance instruction signal) from the control unit 14, the receiver 98 of the cutting apparatus 204 sends it to the control apparatus 96. The control apparatus 96 controls operation of the blade conveying arm 230 and so forth based on this control signal (second conveyance instruction signal) to carry out the cutting blade 82 from the chassis 214 of the automated blade conveying vehicle 206 and transfer the cutting blade 82 to the blade holding part 228. Specifically, the cutting blade 82 in the blade case 216 indicated from the control unit 14 through the control signal (second conveyance instruction signal) is carried out to be transferred to the blade holding part 228.

When the cutting blade 82 is transferred to the cutting apparatus 204, the control apparatus 96 generates a notification signal (second conveyance completion signal) for notifying that the conveyance of the cutting blade 82 to the cutting apparatus 204 has been completed, for example. The notification signal (second conveyance completion signal) generated by the control apparatus 96 is transmitted from the transmitter 100 to the control unit 14. By such a procedure, the cutting blade 82 housed in the stock unit 208 can be conveyed to the cutting apparatus 204 according to need.

Thereafter, the cutting apparatus 204 transfers the cutting blade 82 from the above-described blade holding part 228 to the blade changer 232, for example. Then, by this blade changer 232, the used cutting blade 82 that has been already mounted to the cutting unit 80 is replaced by the cutting blade 82 received from the blade holding part 228.

The used cutting blade 82 detached from the cutting unit 80 is transferred to the blade holding part 228. The blade conveying arm 230 places the used cutting blade 82 held by the blade holding part 228 on the chassis 214 of the automated blade conveying vehicle 206 that is waiting. At this time, the used cutting blade 82 is placed on the blade case 216 indicated by the control apparatus 96, for example.

When the used cutting blade 82 is conveyed to the automated blade conveying vehicle 206, the control apparatus 96 generates a notification signal (third conveyance completion signal) for notifying that the conveyance of the used cutting blade 82 to the automated blade conveying vehicle 206 has been completed. The notification signal (third conveyance completion signal) generated by the control apparatus 96 is transmitted from the transmitter 100 to the control unit 14. Information on the blade case 216 on which the used cutting blade 82 is placed (information of the information providing part 214b corresponding to the blade case 216) is included in this notification signal (third conveyance completion signal).

When receiving the notification signal (third conveyance completion signal) transmitted from the transmitter 100 of the cutting apparatus 204, the receiver 134 of the control unit 14 sends it to the control part 132. When checking the notification signal (third conveyance completion signal) from the cutting apparatus 204, the control part 132 issues, to the automated blade conveying vehicle 206, an instruction to move to a position near the stock unit 208 and wait. Specifically, the control part 132 generates a control signal (third wait instruction signal) equivalent to this instruction and transmits it from the transmitter 136 to the automated blade conveying vehicle 206.

When receiving the control signal (third wait instruction signal) from the control unit 14, the receiver 222 of the automated blade conveying vehicle 206 sends it to the control apparatus 220. The control apparatus 220 controls operation of the wheels 218 and so forth based on this control signal (third wait instruction signal) and causes the automated blade conveying vehicle 206 to travel along the conveyance passage 6.

When confirming that the automated blade conveying vehicle 206 has moved to near the stock unit 208, the control apparatus 220 stops the wheels 218 and so forth. Furthermore, the control apparatus 220 generates a notification signal (third standby signal) for notifying that the automated blade conveying vehicle 206 is waiting at a position near the stock unit 208. The notification signal (third standby signal) generated by the control apparatus 220 is transmitted from the transmitter 224 to the control unit 14.

When receiving the notification signal (third standby signal) transmitted from the transmitter 224 of the automated blade conveying vehicle 206, the receiver 134 of the control unit 14 sends it to the control part 132. When checking the notification signal (third standby signal) from the automated blade conveying vehicle 206, the control part 132 issues, to the stock unit 208, an instruction to carry out the used cutting blade 82 from the automated blade conveying vehicle 206. Specifically, the control part 132 generates a control signal (third conveyance instruction signal) equivalent to this instruction and transmits it from the transmitter 136 to the stock unit 208.

When receiving the control signal (third conveyance instruction signal) from the control unit 14, the receiver 34 of the stock unit 208 sends it to the control apparatus 32. The control apparatus 32 controls operation of the blade conveying arm 212 and so forth based on this control signal (third conveyance instruction signal) to carry out the used cutting blade 82 from the chassis 214 of the automated blade conveying vehicle 206 and house the used cutting blade 82 to the blade stocker 210. Specifically, the cutting blade 82 in the blade case 216 indicated from the control unit 14 through the control signal (third conveyance instruction signal) is carried out to be transferred to the blade stocker 210.

By such a procedure, the cutting blade 82 housed in the stock unit 208 can be conveyed to the cutting apparatus 204 according to need. Furthermore, the used cutting blade 82 detached from the cutting unit 80 of the cutting apparatus 204 can be collected. Here, the automated blade conveying vehicle 206 is made to wait on the spot during work of replacing the cutting blade 82. However, for example, another cutting blade 82 may be conveyed to another cutting apparatus 204 during this work of replacing the cutting blade 82.

Furthermore, the above-described procedure can be changed within a range in which the cutting blade 82 can be properly conveyed. For example, plural steps included in the above-described procedure may be simultaneously executed and the order of the steps may be changed within a range in which no trouble is caused in the conveyance of the cutting blade 82. Similarly, an arbitrary step may be added, changed, or omitted within a range in which no trouble is caused in the conveyance of the cutting blade 82.

As described above, the conveyance system 202 according to the present embodiment includes the conveyance passage 6 set across plural cutting apparatuses (processing apparatuses) 204, the automated blade conveying vehicle 206 including the chassis (blade holding part) 214, the wheels (traveling mechanism) 218, and the receiver 222, and the stock unit 208 including the blade conveying arm (blade conveying part) 212 and the receiver 34.

Thus, the cutting blade 82 can be conveyed to each of the plural cutting apparatuses 204 by conveying the cutting blade 82 housed in the blade stocker 210 to the chassis 214 of the automated blade conveying vehicle 206 by the blade conveying arm 212 and causing this automated blade conveying vehicle 206 to travel on the conveyance passage 6. Furthermore, in the conveyance system 202 according to the present embodiment, the conveyance passage 6 is set in a space directly above the cutting apparatus 204. For this reason, the structures of the side surfaces of each cutting apparatus 204 do not need to be considered when this conveyance passage 6 is designed. That is, construction of the conveyance system 202 becomes easy.

(Embodiment 3)

In the present embodiment, a stock unit with a different structure from the stock unit 8 and the stock unit 208 will be described. The basic configuration of a conveyance system and so forth into which the stock unit of the present embodiment is incorporated is the same as the conveyance system and so forth according to Embodiments 1 and 2. Thus, a common constituent element is given the same numeral and detailed description is omitted.

Figure 22:
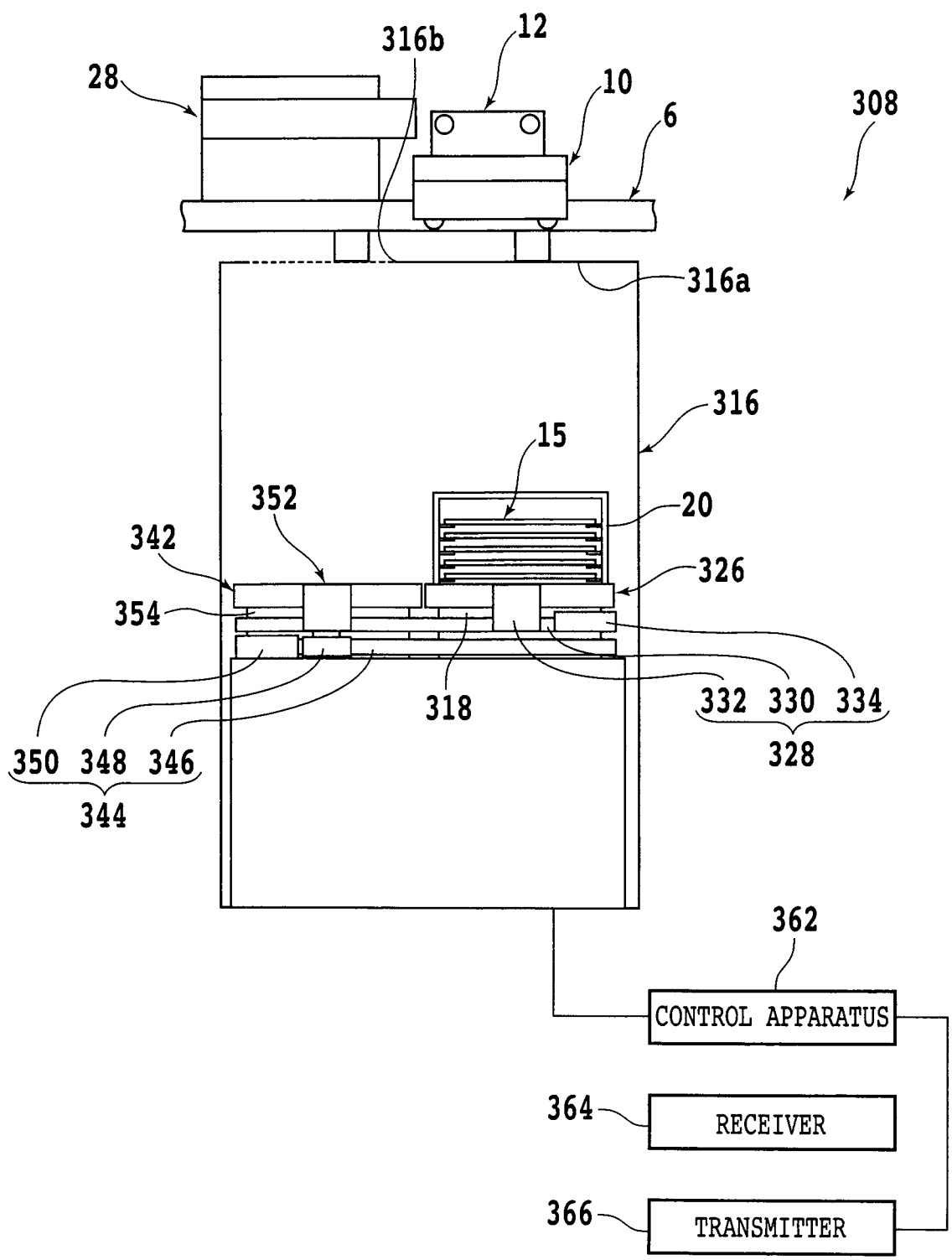
FIG. 22 is a side view schematically illustrating a configuration example of a stock unit according to embodiment 3.
Figure 23:
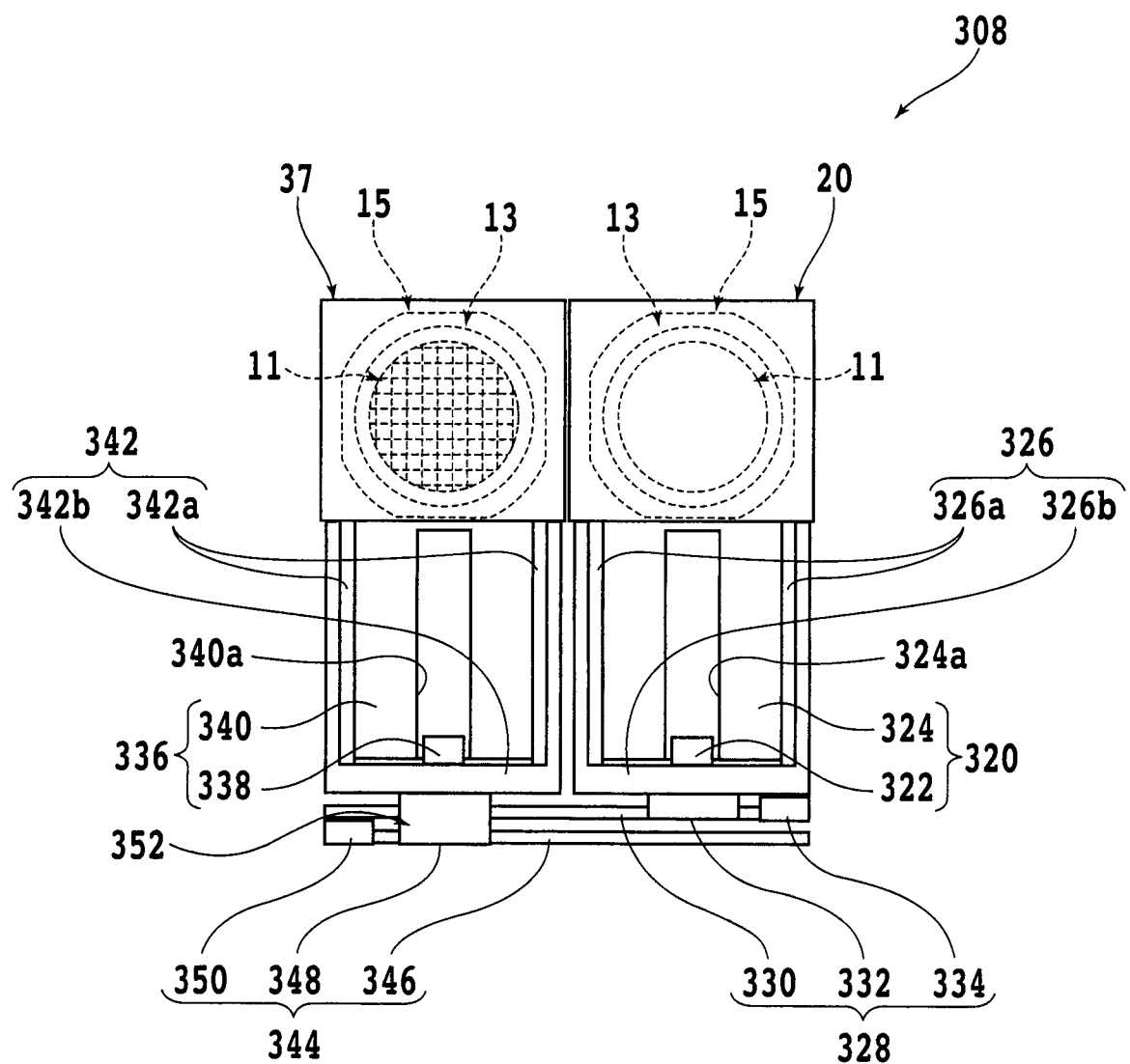
FIG. 23 is a plan view schematically illustrating the structure of the inside of the stock unit according to embodiment 3.

FIG. 22 is a side view schematically illustrating a configuration example of a stock unit 308 according to the present embodiment, and FIG. 23 is a plan view schematically illustrating the structure of the inside of the stock unit 308. As illustrated in FIG. 22, the stock unit 308 includes a casing 316 that houses various constituent elements. In this FIG. 22, only the contour of the casing 316 is illustrated for convenience of description.

In the casing 316, a cassette holding base 318 that moves up and down by a first raising-lowering mechanism (not illustrated) of a ball screw type is disposed, for example. The cassette (workpiece stocker) 20 that can house plural workpieces 11 is placed on the upper surface of the cassette holding base 318. This cassette 20, for example, houses the workpieces 11 in the state of being supported by the frame 15 with the intermediary of the tape 13 as described above.

As illustrated in FIG. 23, a first workpiece movement unit 320 that grasps and moves the frame 15 is disposed at a first position that faces the cassette holding base 318 (cassette 20). The first workpiece movement unit 320 includes a grasping part 322 that vertically grasps the frame 15 and a drive part 324 that moves the grasping part 322 in a substantially horizontal direction.

A slit-shaped opening 324a that extends substantially horizontally toward the cassette holding base 318 is formed in the upper surface of the drive part 324, and the drive part 324 moves the grasping part 322 in a first direction along this opening 324a. That is, the grasping part 322 moves in such a manner as to get closer to the cassette holding base 318 or get further away from the cassette holding base 318.

Thus, for example, when the height of the frame 15 housed in the cassette 20 is adjusted to the height of the grasping part 322 by the first raising-lowering mechanism and the grasping part 322 is brought close to the cassette holding base 318, the frame 15 in the cassette 20 can be grasped by the grasping part 322. Furthermore, when the grasping part 322 is brought further away from the cassette holding base 318 after the frame 15 in the cassette 20 is grasped by the grasping part 322, the frame 15 can be drawn out to the outside of the cassette 20.

Around the first workpiece movement unit 320, a first temporary putting base 326 on which the frame 15 carried out from the cassette 20 is temporarily put is disposed. The first temporary putting base 326 includes a pair of guide parts 326a that are each long in the first direction and a base part 326b that is long in a second direction that is perpendicular to the first direction and is horizontal. The pair of guide parts 326a are coupled through the base part 326b in such a manner that the longitudinal directions thereof are parallel to each other. The frame 15 drawn out from the cassette 20 by the first workpiece movement unit 320 is placed on the pair of guide parts 326a.

The first temporary putting base 326 is supported by a first temporary putting base movement part 328 that moves this first temporary putting base 326 in the second direction. The first temporary putting base movement part 328 includes a guide rail 330 that is long in the second direction. A moving member 332 is slidably attached to the guide rail 330.

A nut part (not illustrated) is disposed on the moving member 332 and a ball screw (not illustrated) substantially parallel to the guide rail 330 is screwed to this nut part. A pulse motor 334 is coupled to one end of the ball screw. When the ball screw is rotated by the pulse motor 334, the moving member 332 moves in the second direction along the guide rail 330.

The base part 326b of the first temporary putting base 326 is fixed to the upper part of the moving member 332. Thus, the first temporary putting base 326 moves in the second direction together with the moving member 332. The first temporary putting base movement part 328 is configured to be capable of moving the first temporary putting base 326 between the first position and a second position adjacent to this first position.

A second workpiece movement unit 336 that grasps and moves the frame 15 is disposed at the second position. That is, the second workpiece movement unit 336 is disposed adjacent to the first workpiece movement unit 320. The structure of the second workpiece movement unit 336 is the same as the structure of the first workpiece movement unit 320.

Specifically, the second workpiece movement unit 336 includes a grasping part 338 that vertically grasps the frame 15 and a drive part 340 that moves the grasping part 338 in a substantially horizontal direction. A slit-shaped opening 340a that is long in the first direction is formed in the upper surface of the drive part 340 and the drive part 340 moves the grasping part 338 along this opening 440a.

Around the second workpiece movement unit 336, a second temporary putting base 342 having the same structure as the first temporary putting base 326 is disposed. That is, the second temporary putting base 342 includes a pair of guide parts 342a that are each long in the first direction and a base part 342b that is long in the second direction, which is perpendicular to the first direction and is horizontal. The pair of guide parts 342a are coupled through the base part 342b in such a manner that the longitudinal directions thereof are parallel to each other.

The second temporary putting base 342 is supported by a second temporary putting base movement part 344 that moves this second temporary putting base 342 in the second direction and the vertical direction. The second temporary putting base movement part 344 includes a guide rail 346 that is long in the second direction. A moving member 348 is slidably attached to the guide rail 346.

A nut part (not illustrated) is disposed on the moving member 348 and a ball screw (not illustrated) substantially parallel to the guide rail 346 is screwed to this nut part. A pulse motor 350 is coupled to one end of the ball screw. When the ball screw is rotated by the pulse motor 350, the moving member 348 moves in the second direction along the guide rail 346.

The base part 342b of the second temporary putting base 342 is fixed to the upper part of the moving member 348 with the intermediary of a raising-lowering mechanism 352 formed of an air cylinder and so forth. Thus, the second temporary putting base 342 moves in the second direction together with the moving member 348 and the raising-lowering mechanism 352 and moves up and down by the raising-lowering mechanism 352. The second temporary putting base movement part 344 is configured to be capable of moving the second temporary putting base 342 between the second position and the first position adjacent to this second position.

Figure 24:
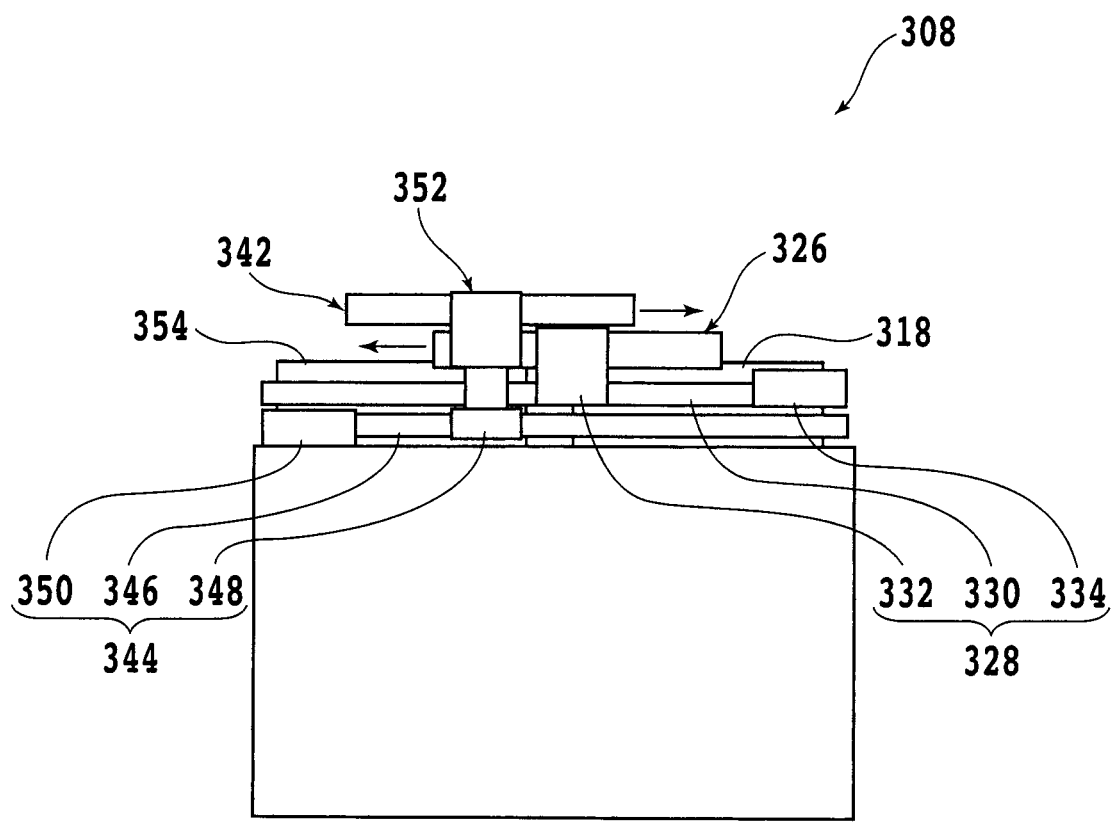
FIG. 24 is a side view schematically illustrating how a first temporary putting base and a second temporary putting base of the stock unit according to embodiment 3 are moved in a second direction and the positions of the first temporary putting base and the second temporary putting base are interchanged.

FIG. 24 is a side view schematically illustrating how the first temporary putting base 326 and the second temporary putting base 342 are moved in the second direction and the position of the first temporary putting base 326 and the position of the second temporary putting base 342 are interchanged. When the position of the first temporary putting base 326 and the position of the second temporary putting base 342 are interchanged, first, the second temporary putting base 342 is raised by the raising-lowering mechanism 352. Specifically, the second temporary putting base 342 is positioned to a rising position at which the height of the lower end of the second temporary putting base 342 is higher than the height of the upper end of the first temporary putting base 326.

Thereafter, in the state in which the second temporary putting base 342 is positioned at the rising position, the second temporary putting base 342 is moved to the first position side by the second temporary putting base movement part 344. Furthermore, at the same timing, the first temporary putting base 326 is moved to the second position side by the first temporary putting base movement part 328.

In FIG. 24, how the first temporary putting base 326 is moved from the first position to the second position and the second temporary putting base 342 is moved from the second position to the first position is illustrated.

After the movement of the first temporary putting base 326 and the second temporary putting base 342 is completed, the second temporary putting base 342 is lowered by the raising-lowering mechanism 352 and the second temporary putting base 342 is positioned to a reference position at which the height of the lower end of the second temporary putting base 342 is substantially equal to the height of the lower end of the first temporary putting base 326. As above, in the stock unit 308, the first temporary putting base 326 and the second temporary putting base 342 can be moved to be interchanged between the first position and the second position by the first temporary putting base movement part 328 and the second temporary putting base movement part 344.

A conveying vehicle holding base (storage member holding base) 354 that is raised and lowered by a ball-screw-type second raising-lowering mechanism, not illustrated, is disposed in a position facing the second position where the second workpiece movement unit 336 is disposed. The chassis 37 of the automated workpiece conveying vehicle 10 is placed on an upper surface of the conveying vehicle holding base 354. As illustrated in FIG. 22, an opening 316b is defined in a ceiling 316a of the casing 316 and extends vertically therethrough in a region directly above the conveying vehicle holding base 354. The opening 316b is of such a shape and size that allow the chassis 37 placed on the conveying vehicle holding base 354 to pass therethrough.

A control apparatus 362 for controlling operation of the stock unit 308 is connected to constituent elements such as the first raising-lowering mechanism that raises and lowers the cassette holding base 318, the first workpiece movement unit 320, the first temporary putting base movement part 328, the second workpiece movement unit 336, the second temporary putting base movement part 344, the raising-lowering mechanism 352, and the second raising-lowering mechanism that raises and lowers the conveying vehicle holding base 354. Typically, the control apparatus 362 is formed of a computer including a processing apparatus such as a CPU and a storing apparatus such as a flash memory, and functions of the control apparatus 362 are implemented by causing the processing apparatus and so forth to operate in accordance with software stored in the storing apparatus.

A receiver 364 that receives a signal for control (control signal) transmitted from the control unit 14 of the conveyance system and a transmitter 366 that transmits a signal for notification (notification signal) to the control unit 14 are further connected to the control apparatus 362. The control apparatus 362 controls the operation of the stock unit 308 based on the signal received by the receiver 364. Furthermore, the control apparatus 362 transmits the necessary signal to the control unit 14 through the transmitter 366.

Next, operation of the stock unit 308 according to the present embodiment will be described. FIG. 25A, FIG. 25B, FIG. 26A, and FIG. 26B are plan views schematically illustrating an example of operation of the stock unit 308. In the present embodiment, the description will be made about operation in the case in which the first temporary putting base 326 is positioned at the first position and the second temporary putting base 342 is positioned at the second position. However, operation in the case in which the first temporary putting base 326 is positioned at the second position and the second temporary putting base 342 is positioned at the first position is also the same.

For example, the conveying unit 12 places the chassis 37 of the automated workpiece conveying vehicle 10 in which the workpiece 11 after processing is housed on the conveying vehicle holding base 354. On the cassette holding base 318, the cassette 20 in which the workpiece 11 (frame 15) before processing is housed is placed in advance.

Figure 25A:
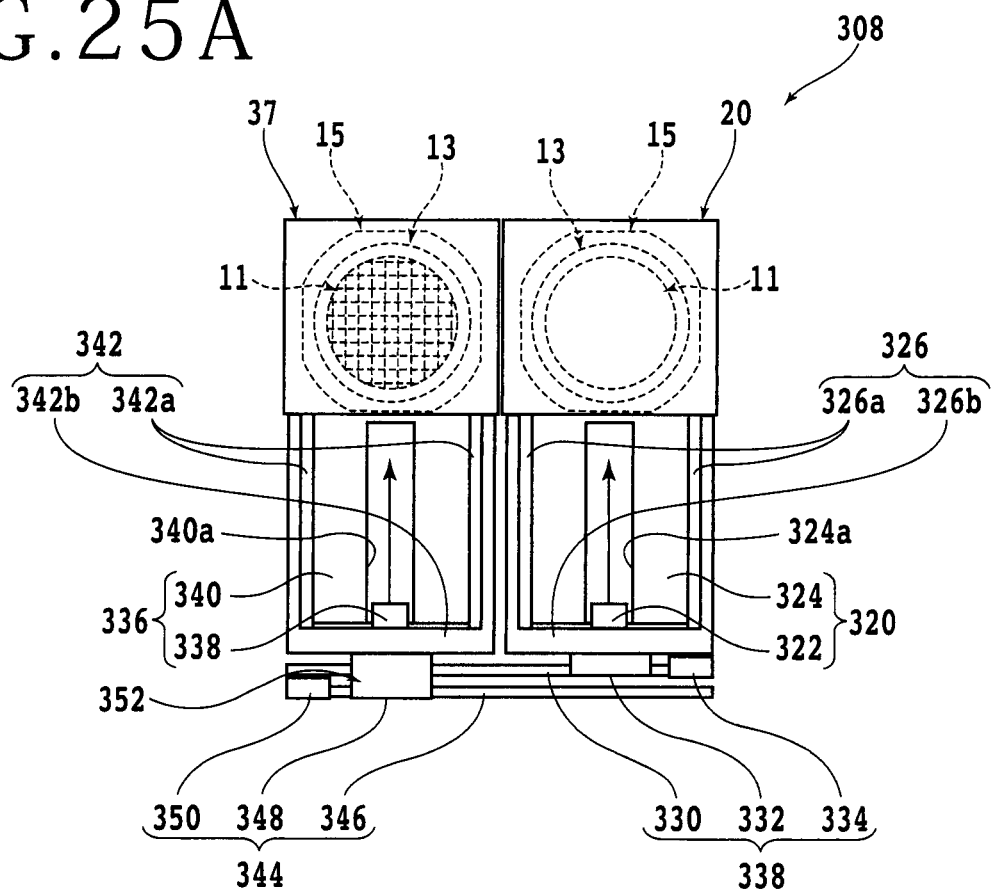
FIG. 25A and FIG. 25B are plan views schematically illustrating an example of operation of the stock unit according to embodiment 3.

Thereafter, as illustrated in FIG. 25A, the grasping part 322 is brought close to the cassette 20 on the cassette holding base 318 and the frame 15 housed in the cassette 20 is grasped by the grasping part 322. At the same timing, the grasping part 338 is brought close to the chassis 37 on the conveying vehicle holding base 354 and the frame 15 housed in the chassis 37 is grasped by the grasping part 338.

Figure 25B:
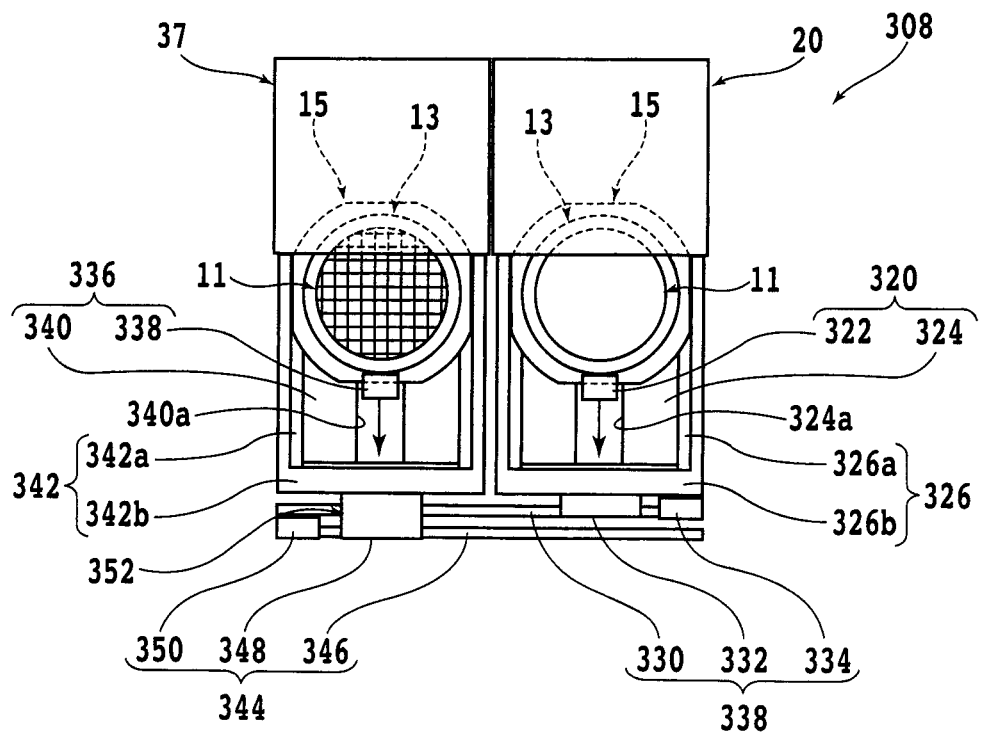

After the frame 15 in the cassette 20 is grasped by the grasping part 322, the grasping part 322 is brought further away from the cassette holding base 318 as illustrated in FIG. 25B. Similarly, after the frame 15 in the chassis 37 is grasped by the grasping part 338, the grasping part 338 is brought further away from the conveying vehicle holding base 354 as illustrated in FIG. 25B. Thereby, the workpiece 11 before processing is drawn out from the cassette 20 to the first temporary putting base 326, and the workpiece 11 after processing is drawn out from the chassis 37 to the second temporary putting base 342.

Figure 26A:
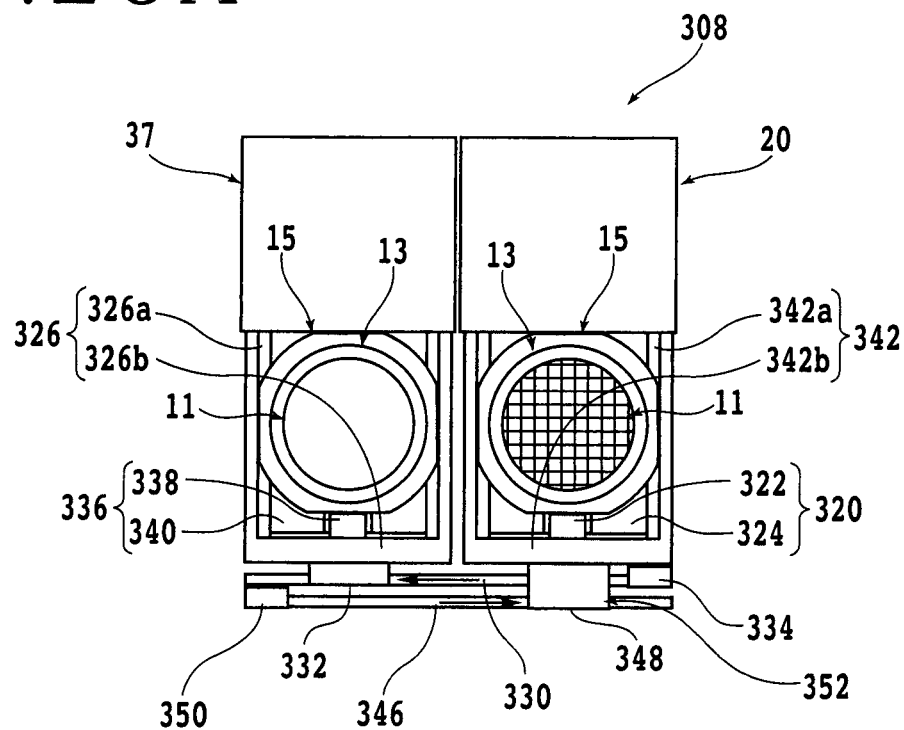
FIG. 26A and FIG. 26B are plan views schematically illustrating the example of the operation of the stock unit according to embodiment 3.

Next, as illustrated in FIG. 26A, the first temporary putting base 326 and the second temporary putting base 342 are moved to be interchanged between the first position and the second position. Specifically, the second temporary putting base 342 is raised by the raising-lowering mechanism 352 and is positioned to the rising position. Then, the second temporary putting base 342 is moved toward the first position side along the second direction.

Furthermore, at the same timing, the first temporary putting base 326 is moved toward the second position side along the second direction. After the movement of the first temporary putting base 326 and the second temporary putting base 342 is completed, the second temporary putting base 342 is lowered by the raising-lowering mechanism 352 and is positioned to the reference position. As a result, the first temporary putting base 326 is positioned to the second position facing the conveying vehicle holding base 354 and the second temporary putting base 342 is positioned to the first position facing the cassette holding base 318.

Figure 26B:
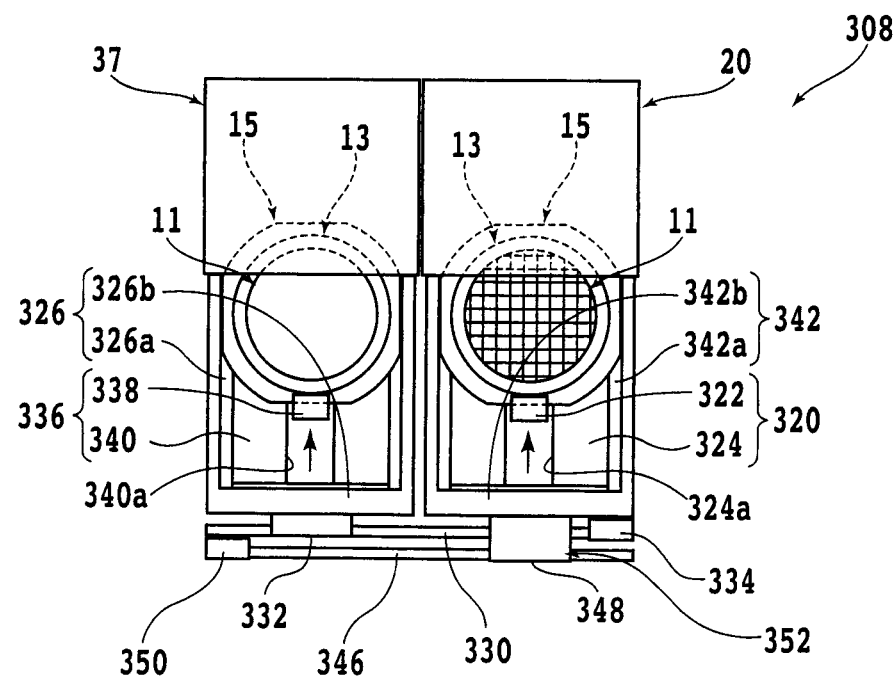

Thereafter, as illustrated in FIG. 26B, the frame 15 on the first temporary putting base 326 is grasped by the grasping part 338 and the grasping part 338 is brought close to the chassis 37 on the conveying vehicle holding base 354. Thereby, the frame 15 that supports the workpiece 11 before processing and is on the first temporary putting base 326 is housed in the chassis 37 on the conveying vehicle holding base 354.

At the same timing, the frame 15 on the second temporary putting base 342 is grasped by the grasping part 322, and the grasping part 322 is brought close to the cassette 20 on the cassette holding base 318. Thereby, the frame 15 that supports the workpiece 11 after processing and is on the second temporary putting base 342 is housed in the cassette 20 on the cassette holding base 318.

The conveying unit 12 conveys the chassis 37 from the conveying vehicle holding base 354 after the frame 15 on the first temporary putting base 326 has been stored in the chassis 37 on the conveying vehicle holding base 354. Through the above, the workpiece 11 after processing can be conveyed from the automated workpiece conveying vehicle 10 to the stock unit 308 and the workpiece 11 before processing can be conveyed from the stock unit 308 to the automated workpiece conveying vehicle 10.

The first temporary putting base 326 and the second temporary putting base 342 have the same functions and the frame 15 carried out from the cassette 20 can be temporarily put on either of the first temporary putting base 326 or the second temporary putting base 342. For example, when the second temporary putting base 342 is positioned at the first position, the frame 15 carried out from the cassette 20 is temporarily put on the second temporary putting base 342.

Furthermore, the above-described first workpiece movement unit 320 moves the workpiece 11 between the first temporary putting base 326 or the second temporary putting base 342 positioned at the first position and the cassette holding base 318 (cassette 20). Similarly, the second workpiece movement unit 336 moves the workpiece 11 between the second temporary putting base 342 or the first temporary putting base 326 positioned at the second position and the conveying vehicle holding base 354 (chassis 37).

The present invention is not limited to the description of the above-described embodiments and can be carried out with various changes. For example, the cutting apparatus 204 of the above-described embodiment is equipped with the blade raising-lowering mechanism 226 for raising and lowering the cutting blade 82. However, a blade raising-lowering mechanism may be attached to the conveyance passage 6 or the automated blade conveying vehicle 206. In this case, the general versatility of the conveyance system becomes higher compared with the case in which the cutting apparatus is equipped with the blade raising-lowering mechanism, or the like.

Furthermore, the conveyance passage 6 may have a space (waiting region) for allowing two automated workpiece conveying vehicles 10 or the like to pass each other. In addition, the conveyance passage 6 may be set as what is called a one-way passage on which only traveling of the automated workpiece conveying vehicle 10 or the like in one direction is permitted. In this case, the conveyance passage 6 for outward traveling and the conveyance passage 6 for homeward traveling may be set on a cutting apparatus (processing apparatus).

Moreover, in the above-described embodiments, the information providing part 102b such as an identification code or wireless tag is set on the passage part 102. However, it is also possible to attach an information providing part to the guide part 104. In this case, it is preferable to attach the information providing part to a wall surface of the inside of the guide part 104, the upper end part of the guide part 104, or the like, for example.

In addition, it is also possible to incorporate the blade stocker 210, the blade conveying arm (blade conveying part) 212, and so forth of the stock unit 208 into the stock unit 308.

Besides, structures, methods, and so forth relating to the above-described embodiments, modification examples, and so forth can be implemented with appropriate changes without departing from the range of the object of the present invention.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A conveyance system for conveying a workpiece to each of a plurality of processing apparatuses, comprising:
   a conveyance passage disposed in a space directly above the processing apparatus across a plurality of the processing apparatuses;
   an automated conveying vehicle for traveling on the conveyance passage, the automated conveying vehicle including a storage member for storing a workpiece, traveling mechanisms mounted on the storage member, and a receiver for receiving control signals;
   a stock unit including a storage member holding base for holding the storage member in transferring the workpiece from a workpiece stocker storing workpieces therein to the storage member of the automated conveying vehicle, and a receiver for receiving control signals;
   a storage member conveying unit for conveying the storage member between a region of the conveyance passage above the stock unit and the storage member holding base of the stock unit or between a region of the conveyance passage above the processing apparatus and an inside of the processing apparatus; and
   a control unit including a transmitter for transmitting control signals to the processing apparatus, the automated conveying vehicle, and the stock unit, a receiver for receiving notification signals transmitted from the processing apparatus, and a control signal generating section for generating control signals to be transmitted from the transmitter, wherein
   the control signal generating section of the control unit generates control signals to be transmitted from the transmitter of the control unit on a basis of notification signals received by the receiver of the control unit,
   the transmitter of the control unit transmits control signals generated by the control signal generating section of the control unit to the processing apparatus, the automated conveying vehicle, and the stock unit,
   the automated conveying vehicle travels on the conveyance passage on a basis of control signals received by the receiver, and
   the storage member of the automated conveying vehicle is conveyed, together with the workpiece stored in the storage member, from the region of the conveyance passage above the processing apparatus to the inside of the processing apparatus.

2. The conveyance system according to claim 1, wherein the conveyance passage is set on an upper surface of the processing apparatus.

3. The conveyance system according to claim 2, wherein the automated conveying vehicle includes the storage member conveying unit.

4. The conveyance system according to claim 1, wherein the automated conveying vehicle includes the storage member conveying unit.

* * * * *